(12) United States Patent
DeMuth et al.

(10) Patent No.: US 10,518,328 B2
(45) Date of Patent: Dec. 31, 2019

(54) ADDITIVE MANUFACTURING SYSTEM AND METHOD

(71) Applicant: Seurat Technologies, Inc., Mountain View, CA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene M. Berdichevsky, Oakland, CA (US)

(73) Assignee: SEURAT TECHNOLOGIES, INC., Mountain View, CA (US)

( * ) Notice: Subject to any disclaimer, the term of this patent is extended or adjusted under 35 U.S.C. 154(b) by 199 days.

(21) Appl. No.: 15/336,321

(22) Filed: Oct. 27, 2016

(65) Prior Publication Data
US 2017/0120518 A1  May 4, 2017

Related U.S. Application Data

(60) Provisional application No. 62/248,758, filed on Oct. 30, 2015, provisional application No. 62/248,765, (Continued)

(51) Int. Cl.
*B29C 67/00* (2017.01)
*B22F 3/105* (2006.01)
(Continued)

(52) U.S. Cl.
CPC .............. *B22F 3/1055* (2013.01); *B22F 3/24* (2013.01); *B23K 15/002* (2013.01);
(Continued)

(58) Field of Classification Search
CPC ......... B33Y 99/00; B33Y 40/00; B33Y 10/00; B33Y 50/02
See application file for complete search history.

(56) References Cited

U.S. PATENT DOCUMENTS 3,080,760 A    3/1963  Dirk
4,286,466 A    9/1981  Stewart
(Continued)

FOREIGN PATENT DOCUMENTS

CN    206217173    6/2017
DE    102013000511 A1    7/2014
(Continued)

OTHER PUBLICATIONS

Peeyush Nandwana et al. Recyclability Study on Inconel 718 and Ti-6Al-4V Powders for Use in Electron Beam Melting. The Minerals, Metals & Materials Society and ASM International 2015.
(Continued)

*Primary Examiner* — Nahida Sultana
(74) *Attorney, Agent, or Firm* — David R. Stevens; Stevens Law Group

(57) ABSTRACT

An additive manufacturing system including a two-dimensional energy patterning system for imaging a powder bed is disclosed. Improved optical systems supporting beam combining, beam steering, and both patterned and unpatterned beam recycling and re-use are described.

6 Claims, 24 Drawing Sheets

Related U.S. Application Data filed on Oct. 30, 2015, provisional application No. 62/248,770, filed on Oct. 30, 2015, provisional application No. 62/248,776, filed on Oct. 30, 2015, provisional application No. 62/248,783, filed on Oct. 30, 2015, provisional application No. 62/248,791, filed on Oct. 30, 2015, provisional application No. 62/248,799, filed on Oct. 30, 2015, provisional application No. 62/248,966, filed on Oct. 30, 2015, provisional application No. 62/248,968, filed on Oct. 30, 2015, provisional application No. 62/248,969, filed on Oct. 30, 2015, provisional application No. 62/248,980, filed on Oct. 30, 2015, provisional application No. 62/248,989, filed on Oct. 30, 2015, provisional application No. 62/248,780, filed on Oct. 30, 2015, provisional application No. 62/248,787, filed on Oct. 30, 2015, provisional application No. 62/248,795, filed on Oct. 30, 2015, provisional application No. 62/248,821, filed on Oct. 30, 2015, provisional application No. 62/248,829, filed on Oct. 30, 2015, provisional application No. 62/248,833, filed on Oct. 30, 2015, provisional application No. 62/248,835, filed on Oct. 30, 2015, provisional application No. 62/248,839, filed on Oct. 30, 2015, provisional application No. 62/248,841, filed on Oct. 30, 2015, provisional application No. 62/248,847, filed on Oct. 30, 2015, provisional application No. 62/248,848, filed on Oct. 30, 2015.

(51) Int. Cl.

| | | |
|---|---|---|
| *B33Y 10/00* | (2015.01) | |
| *B33Y 30/00* | (2015.01) | |
| *B33Y 40/00* | (2015.01) | |
| *B33Y 50/02* | (2015.01) | |
| *B23K 26/144* | (2014.01) | |
| *B23K 26/342* | (2014.01) | |
| *B23K 26/70* | (2014.01) | |
| *B23K 26/16* | (2006.01) | |
| *B28B 1/00* | (2006.01) | |
| *B23K 26/142* | (2014.01) | |
| *B33Y 70/00* | (2015.01) | |
| *B33Y 99/00* | (2015.01) | |
| *G05B 17/02* | (2006.01) | |
| *G02B 7/14* | (2006.01) | |
| *G02B 15/04* | (2006.01) | |
| *G02B 26/08* | (2006.01) | |
| *G02B 27/14* | (2006.01) | |
| *G02F 1/1333* | (2006.01) | |
| *G02F 1/135* | (2006.01) | |
| *G02F 1/01* | (2006.01) | |
| *H01S 5/00* | (2006.01) | |
| *H01S 5/40* | (2006.01) | |
| *B33Y 80/00* | (2015.01) | |
| *B23K 26/36* | (2014.01) | |
| *B25J 11/00* | (2006.01) | |
| *B23K 26/08* | (2014.01) | |
| *B23K 26/12* | (2014.01) | |
| *B22F 3/24* | (2006.01) | |
| *B23K 37/04* | (2006.01) | |
| *G02B 7/16* | (2006.01) | |
| *G02B 7/182* | (2006.01) | |
| *G02B 15/10* | (2006.01) | |
| *G02B 19/00* | (2006.01) | |
| *G02B 27/00* | (2006.01) | |
| *B29C 64/386* | (2017.01) | |
| *B23K 15/00* | (2006.01) | |
| *B23K 15/06* | (2006.01) | |
| *B23K 26/00* | (2014.01) | |
| *B23K 26/03* | (2006.01) | |
| *B23K 26/082* | (2014.01) | |
| *B23K 101/00* | (2006.01) | |
| *B23K 101/02* | (2006.01) | |
| *B23K 101/24* | (2006.01) | |
| *B29K 105/00* | (2006.01) | |
| *G02B 27/09* | (2006.01) | |
| *G02B 27/28* | (2006.01) | |
| *G07C 3/14* | (2006.01) | |
| *B23K 103/00* | (2006.01) | |

(52) U.S. Cl.
CPC ...... *B23K 15/0006* (2013.01); *B23K 15/0013* (2013.01); *B23K 15/0026* (2013.01); *B23K 15/0086* (2013.01); *B23K 15/0093* (2013.01); *B23K 15/06* (2013.01); *B23K 26/0006* (2013.01); *B23K 26/03* (2013.01); *B23K 26/032* (2013.01); *B23K 26/082* (2015.10); *B23K 26/083* (2013.01); *B23K 26/0846* (2013.01); *B23K 26/123* (2013.01); *B23K 26/127* (2013.01); *B23K 26/1224* (2015.10); *B23K 26/142* (2015.10); *B23K 26/144* (2015.10); *B23K 26/16* (2013.01); *B23K 26/342* (2015.10); *B23K 26/36* (2013.01); *B23K 26/702* (2015.10); *B23K 26/703* (2015.10); *B23K 26/704* (2015.10); *B23K 37/0408* (2013.01); *B23K 37/0426* (2013.01); *B25J 11/00* (2013.01); *B28B 1/001* (2013.01); *B29C 64/386* (2017.08); *B33Y 10/00* (2014.12); *B33Y 30/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 19/0047* (2013.01); *G02B 26/0816* (2013.01); *G02B 27/0068* (2013.01); *G02B 27/141* (2013.01); *G02F 1/0136* (2013.01); *G02F 1/135* (2013.01); *G02F 1/133362* (2013.01); *G05B 17/02* (2013.01); *H01S 5/005* (2013.01); *H01S 5/4012* (2013.01); *B22F 2003/1056* (2013.01); *B22F 2003/1057* (2013.01); *B22F 2003/1058* (2013.01); *B22F 2003/1059* (2013.01); *B22F 2003/247* (2013.01); *B22F 2003/248* (2013.01); *B22F 2998/10* (2013.01); *B22F 2999/00* (2013.01); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B29K 2105/251* (2013.01); *G02B 27/0905* (2013.01); *G02B 27/283* (2013.01); *G02B 27/286* (2013.01); *G05B 2219/49023* (2013.01); *G07C 3/146* (2013.01); *Y02P 10/295* (2015.11); *Y02P 80/40* (2015.11)

(56) References Cited

U.S. PATENT DOCUMENTS

| | | |
|---|---|---|
| 4,718,288 A | 1/1988 | Leschonski |
| 4,771,641 A | 9/1988 | Beltrop |
| 4,782,945 A | 11/1988 | Geiler |

(56) References Cited

U.S. PATENT DOCUMENTS

| | | |
|---|---|---|
| 5,236,637 A | 8/1993 | Hull |
| 5,337,620 A | 8/1994 | Kalidindi |
| 5,583,304 A | 12/1996 | Kalidindi |
| 5,601,733 A | 2/1997 | Partlo |
| 5,682,214 A | 10/1997 | Amako et al. |
| 5,738,088 A | 4/1998 | Townsend |
| 5,837,960 A | 11/1998 | Lewis et al. |
| 6,253,629 B1 | 7/2001 | Lee |
| 6,339,966 B1 | 1/2002 | Kalidindi |
| 6,560,001 B1 | 5/2003 | Igasaki |
| 6,676,892 B2 | 1/2004 | Das |
| 6,851,459 B2 | 2/2005 | Squirrell |
| 7,088,432 B2 | 8/2006 | Zhang |
| 7,713,048 B2 | 5/2010 | Perret |
| 7,777,155 B2 | 8/2010 | Twelves |
| 7,820,241 B2 | 10/2010 | Perreti |
| 7,895,879 B2 | 3/2011 | Robert |
| 8,514,475 B2 | 8/2013 | Deri |
| 8,525,943 B2 | 9/2013 | Burgess |
| 8,562,897 B2 | 10/2013 | Abe |
| 8,902,497 B2 | 12/2014 | Erlandson |
| 8,982,313 B2 | 3/2015 | Escuti |
| 9,114,478 B2 | 8/2015 | Scott |
| 9,136,668 B2 | 9/2015 | Bayramian |
| 9,186,847 B2 | 11/2015 | Fruth |
| 9,283,593 B2 | 3/2016 | Bruck |
| 9,308,583 B2 | 4/2016 | El-dasher |
| 9,331,452 B2 | 5/2016 | Bayramian |
| 9,360,816 B1 | 6/2016 | Mabuchi |
| 9,522,426 B2 | 12/2016 | Das |
| 9,573,193 B2 | 2/2017 | Buller |
| 9,815,139 B2 | 11/2017 | Bruck |
| 9,855,625 B2 | 1/2018 | El-dasher |
| 9,889,450 B2 | 2/2018 | She |
| 9,999,924 B2 | 6/2018 | Dave |
| 10,166,751 B2 | 1/2019 | Kramer |
| 10,195,692 B2 | 2/2019 | Rockstroh |
| 10,195,693 B2 | 2/2019 | Buller |
| 2001/0008230 A1* | 7/2001 | Keicher .............. B01F 13/0255 219/121.63 |
| 2001/0045678 A1 | 11/2001 | Kubo et al. |
| 2002/0015654 A1 | 2/2002 | Das |
| 2002/0021723 A1 | 2/2002 | Amako et al. |
| 2002/0124664 A1 | 9/2002 | Call |
| 2002/0130279 A1 | 9/2002 | Jain et al. |
| 2002/0149137 A1 | 10/2002 | Jang |
| 2003/0052105 A1 | 3/2003 | Nagano |
| 2004/0063198 A1 | 4/2004 | Tilles |
| 2005/0083498 A1 | 4/2005 | Jeng |
| 2005/0263932 A1 | 12/2005 | Heugel |
| 2005/0280185 A1 | 12/2005 | Russell et al. |
| 2006/0111807 A1 | 5/2006 | Gothait |
| 2007/0077323 A1 | 4/2007 | Stonesmith et al. |
| 2008/0201008 A1 | 8/2008 | Twelves |
| 2008/0262659 A1 | 10/2008 | Huskamp |
| 2009/0020901 A1 | 1/2009 | Schillen |
| 2009/0169664 A1 | 7/2009 | Cox |
| 2009/0206065 A1 | 8/2009 | Kruth |
| 2010/0262272 A1 | 10/2010 | Shkolnik et al. |
| 2011/0000322 A1 | 1/2011 | Chen |
| 2011/0122999 A1 | 5/2011 | Vogtmeier |
| 2011/0233808 A1 | 9/2011 | Davidson |
| 2012/0007888 A1 | 1/2012 | Maiorova |
| 2012/0139166 A1 | 6/2012 | Abe |
| 2013/0078006 A1 | 3/2013 | Kawashima |
| 2013/0101746 A1 | 4/2013 | Keremes |
| 2013/0112672 A1 | 5/2013 | Keremes |
| 2013/0270750 A1 | 10/2013 | Green |
| 2013/0309121 A1 | 11/2013 | Prest et al. |
| 2014/0140882 A1 | 5/2014 | Syassen |
| 2014/0154088 A1 | 6/2014 | Etter Julius |
| 2014/0186205 A1 | 7/2014 | O'Neill |
| 2014/0202381 A1 | 7/2014 | Ederer |
| 2014/0252687 A1 | 9/2014 | El-dasher |
| 2014/0263209 A1 | 9/2014 | Burris |
| 2014/0265034 A1 | 9/2014 | Dudley |
| 2014/0314609 A1 | 10/2014 | Ljungblad |
| 2015/0030494 A1 | 1/2015 | Ward-Close |
| 2015/0061170 A1 | 3/2015 | Engel et al. |
| 2015/0076732 A1 | 3/2015 | Kemmer et al. |
| 2015/0090074 A1 | 4/2015 | Etter et al. |
| 2015/0102526 A1 | 4/2015 | Ward et al. |
| 2015/0125334 A1 | 5/2015 | Uetani |
| 2015/0165681 A1 | 6/2015 | Fish |
| 2015/0251249 A1* | 9/2015 | Fager ................... B22F 3/1055 419/53 |
| 2015/0336330 A1 | 11/2015 | Herzog |
| 2015/0375456 A1 | 12/2015 | Cheverton |
| 2016/0067779 A1 | 3/2016 | Dautova |
| 2016/0114432 A1 | 4/2016 | Ferrar |
| 2016/0121271 A1 | 5/2016 | Lescoche |
| 2016/0144428 A1 | 5/2016 | Mironets |
| 2016/0184893 A1 | 6/2016 | Dave |
| 2016/0193696 A1 | 7/2016 | McFarland |
| 2016/0243652 A1 | 8/2016 | El-dasher |
| 2017/0120332 A1* | 5/2017 | DeMuth ................. B28B 1/001 |
| 2017/0120529 A1 | 5/2017 | Seurat |
| 2017/0165911 A1* | 6/2017 | Kiriyama .............. B33Y 30/00 |
| 2017/0232557 A1* | 8/2017 | DeMuth ................. B33Y 10/00 148/525 |
| 2017/0232637 A1* | 8/2017 | DeMuth ................. B33Y 10/00 264/497 |
| 2018/0029127 A1* | 2/2018 | Ng ....................... B29C 64/153 |
| 2018/0079003 A1* | 3/2018 | Lin ..................... B23K 15/0086 |
| 2018/0086004 A1 | 3/2018 | Van Espen |
| 2018/0215093 A1* | 8/2018 | Chimmalgi ........... B29C 64/264 |
| 2018/0239335 A1* | 8/2018 | Barr ..................... G05B 19/4099 |
| 2018/0257301 A1* | 9/2018 | Ng ....................... B29C 64/153 |
| 2018/0281282 A1* | 10/2018 | Elgar .................... B04C 9/00 |
| 2018/0326664 A1* | 11/2018 | DeMuth ................. B29C 64/282 |
| 2019/0036337 A1 | 1/2019 | Zhang |

FOREIGN PATENT DOCUMENTS

| | | |
|---|---|---|
| DE | 102013205029 A1 | 9/2014 |
| EP | 2964418 B1 | 5/2019 |
| JP | 2001305040 | 10/2001 |
| JP | 2004037111 | 2/2004 |
| JP | 2005335199 | 12/2005 |
| JP | 5933512 B2 | 6/2016 |
| WO | 2012/037694 A2 | 3/2012 |
| WO | WO 2012037694 A2 | 3/2012 |
| WO | 2014/074954 A3 | 5/2014 |
| WO | 2014/179345 A1 | 11/2014 |
| WO | WO 2014179345 A1 | 11/2014 |
| WO | 2015/025171 A2 | 2/2015 |
| WO | 2015/066607 | 5/2015 |
| WO | 2015/086705 A1 | 6/2015 |
| WO | 2015086705 A1 | 6/2015 |
| WO | 2015/134075 A3 | 9/2015 |

OTHER PUBLICATIONS

Lorincz, J. Technology drives cell success. ManufacturingEngineeringMedia.com Aug. 2013; p. 61, left column, third-fourth paragraphs.

* cited by examiner

ADDITIVE MANUFACTURING SYSTEM AND METHOD

CROSS-REFERENCE TO RELATED PATENT APPLICATION

The present disclosure is part of a non-provisional patent application claiming the priority benefit of
U.S. Patent Application No. 62/248,758, filed on Oct. 30, 2015,
U.S. Patent Application No. 62/248,765, filed on Oct. 30, 2015,
U.S. Patent Application No. 62/248,770, filed on Oct. 30, 2015,
U.S. Patent Application No. 62/248,776, filed on Oct. 30, 2015,
U.S. Patent Application No. 62/248,783, filed on Oct. 30, 2015,
U.S. Patent Application No. 62/248,791, filed on Oct. 30, 2015,
U.S. Patent Application No. 62/248,799, filed on Oct. 30, 2015,
U.S. Patent Application No. 62/248,966, filed on Oct. 30, 2015,
U.S. Patent Application No. 62/248,968, filed on Oct. 30, 2015,
U.S. Patent Application No. 62/248,969, filed on Oct. 30, 2015,
U.S. Patent Application No. 62/248,980, filed on Oct. 30, 2015,
U.S. Patent Application No. 62/248,989, filed on Oct. 30, 2015,
U.S. Patent Application No. 62/248,780, filed on Oct. 30, 2015,
U.S. Patent Application No. 62/248,787, filed on Oct. 30, 2015,
U.S. Patent Application No. 62/248,795, filed on Oct. 30, 2015,
U.S. Patent Application No. 62/248,821, filed on Oct. 30, 2015,
U.S. Patent Application No. 62/248,829, filed on Oct. 30, 2015,
U.S. Patent Application No. 62/248,833, filed on Oct. 30, 2015,
U.S. Patent Application No. 62/248,835, filed on Oct. 30, 2015,
U.S. Patent Application No. 62/248,839, filed on Oct. 30, 2015,
U.S. Patent Application No. 62/248,841, filed on Oct. 30, 2015,
U.S. Patent Application No. 62/248,847, filed on Oct. 30, 2015, and
U.S. Patent Application No. 62/248,848, filed on Oct. 30, 2015, which are incorporated by reference in its entirety.

TECHNICAL FIELD

The present disclosure relates generally to a system and method for additive manufacturing. In one embodiment powder bed fusion manufacturing with two-dimensional energy patterning and energy beam reuse are described.

BACKGROUND

Traditional component machining often relies on removal of material by drilling, cutting, or grinding to form a part. In contrast, additive manufacturing, also referred to as 3D printing, typically involves sequential layer by layer addition of material to build a part. Beginning with a 3D computer model, an additive manufacturing system can be used to create complex parts from a wide variety of materials.

One additive manufacturing technique known as powder bed fusion (PBF) uses one or more focused energy sources, such as a laser or electron beam, to draw a pattern in a thin layer of powder by melting the powder and bonding it to the layer below. Powders can be plastic, metal or ceramic. This technique is highly accurate and can typically achieve feature sizes as small as 150-300 um. However, powder bed fusion additive manufacturing machine manufacturers struggle to create machines that can produce printed material in excess of 1 kg/hr. Because of this slow powder-to-solid conversion rate, machine sizes are relatively small due to the length of time it would take to print larger parts. Today's largest machines have printable part volumes generally less than 64 L (40 cm)$^3$. While these printers are capable of printing parts of nearly arbitrary geometry, due to the high machine cost and low powder conversion rate the amortized cost of the machine ends up being very high, resulting in expensive parts.

Unfortunately, increasing part size or decreasing manufacturing costs by simply scaling-up the machine is not an acceptable solution. As a minimum, to melt a given volume of material the laser must deliver both enough energy to bring it up to the melting temperature, and the phase change energy required to melt. If no thermal energy is dissipated in this process, then there is a linear scaling between laser energy deposited over time (laser power), and material throughput rate. If a powder bed fusion additive manufacturing machine maker wants to scale up in material throughput rate they would necessarily need to increase their laser power. This increase in laser power unfortunately increases proportionally with the cost of the laser, and a scale up greatly increases the cost of today's already expensive machines.

Even if laser costs were not a factor, power scaling a laser can have other detrimental effects. Every powdered material has optimum melting properties dependent on power flux. If power is too low, the powder doesn't melt, and if too high the laser can drill into the material (key-holing). Increasing the laser power of a machine already operating at one of these optimum points results necessarily requires an increase in laser area (spot size) to maintain the optimum power flux. Simply increasing the spot size degrades printable resolution, while dividing up the laser into multiple beams increases the system complexity.

In effect, currently available powder bed additive manufacturing machines can be limited in part size, part manufacturing cost, resolution of part details, and part manufacturing throughput.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

An additive manufacturing system which has one or more energy sources, including in one embodiment, one or more laser or electron beams, are positioned to emit one or more energy beams. Beam shaping optics may receive the one or more energy beams from the energy source and form a single beam. An energy patterning unit receives or generates the single beam and transfers a two-dimensional pattern to the beam, and may reject the unused energy not in the pattern. An image relay receives the two-dimensional patterned beam and focuses it as a two-dimensional image to a desired location on a height fixed or movable build platform (e.g. a powder bed). In certain embodiments, some or all of any rejected energy from the energy patterning unit is reused.

In some embodiments, multiple beams from the laser array(s) are combined using a beam homogenizer. This combined beam can be directed at an energy patterning unit that includes either a transmissive or reflective pixel addressable light valve. In one embodiment, the pixel addressable light valve includes both a liquid crystal module having a polarizing element and a light projection unit providing a two-dimensional input pattern. The two-dimensional image focused by the image relay can be sequentially directed toward multiple locations on a powder bed to build a 3D structure.

Figure 1A:
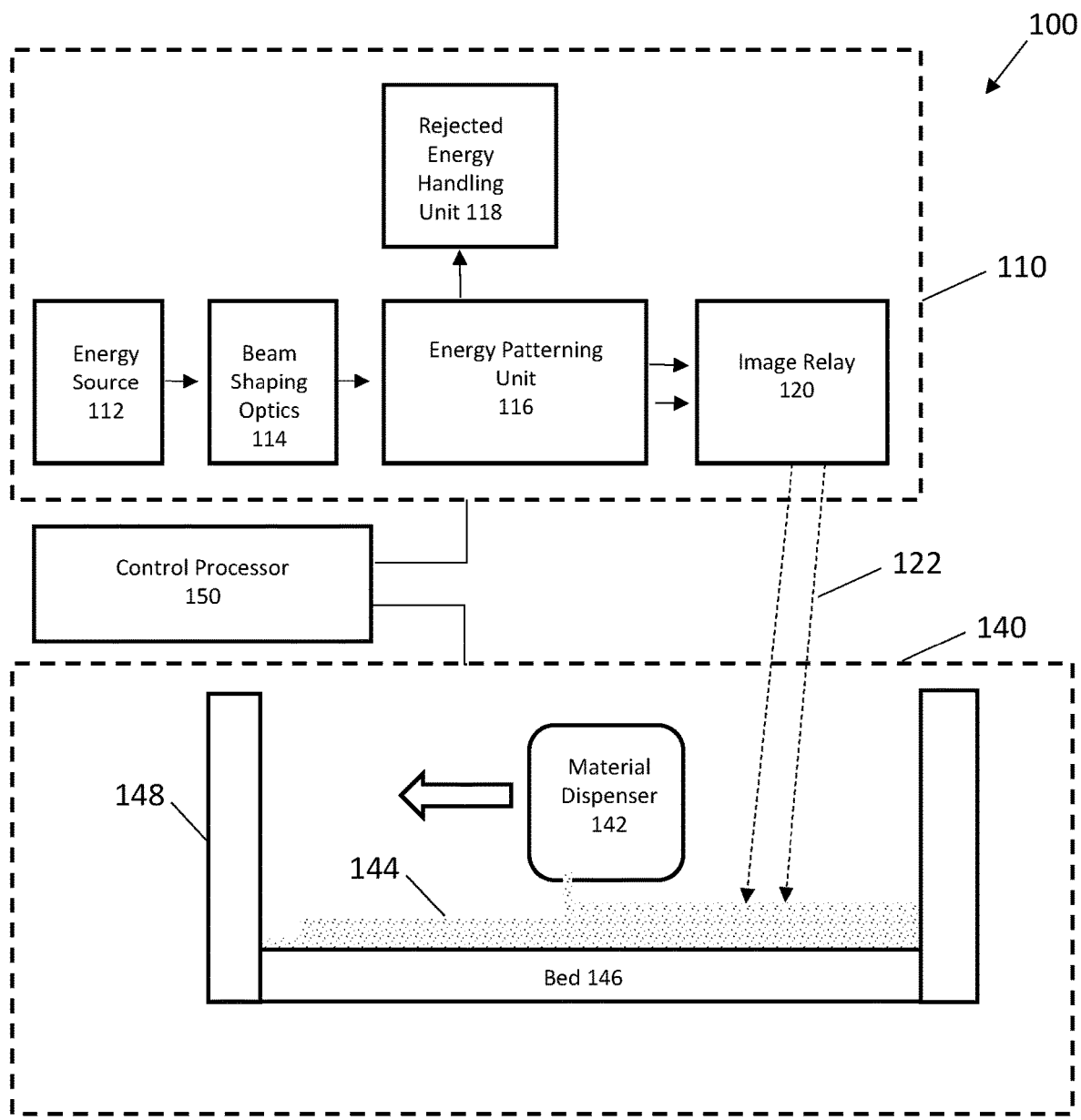
FIG. 1A illustrates an additive manufacturing system.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/MnCl$_2$) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate(Nd:YVO$_4$) laser, Neodymium doped yttrium calcium oxoborateNd:YCa$_4$O(BO$_3$)$^3$ or simply Nd:YCOB, Neodymium glass(Nd:Glass) laser, Titanium sapphire(Ti:sapphire) laser, Thulium YAG (Tm:YAG) laser, Ytterbium YAG (Yb:YAG) laser, Ytterbium:2O$_3$ (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride(Ce:LiSAF, Ce:LiCAF), Promethium 147 doped phosphate glass(147Pm$^{+3}$:Glass) solid-state laser, Chromium doped chrysoberyl (alexandrite) laser, Erbium doped anderbium-ytterbium co-doped glass lasers, Trivalent uranium doped calcium fluoride (U:CaF$_2$) solid-state laser, Divalent samarium doped calcium fluoride(Sm:CaF$_2$) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
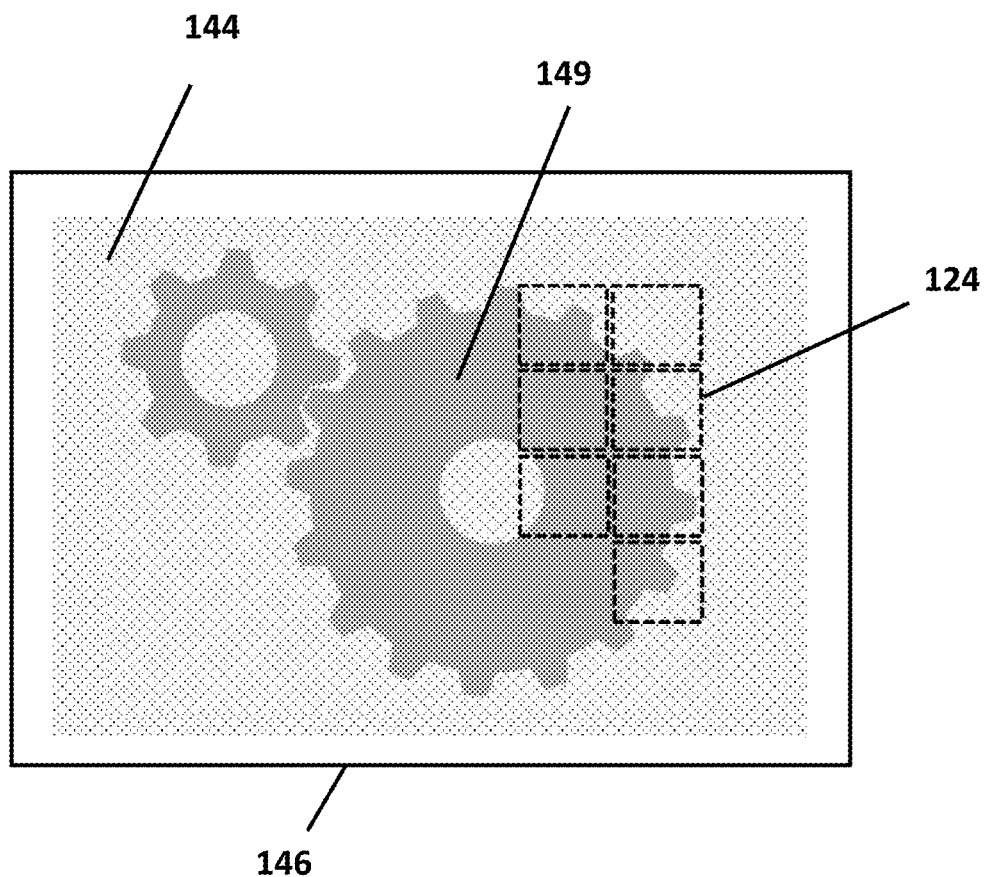
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
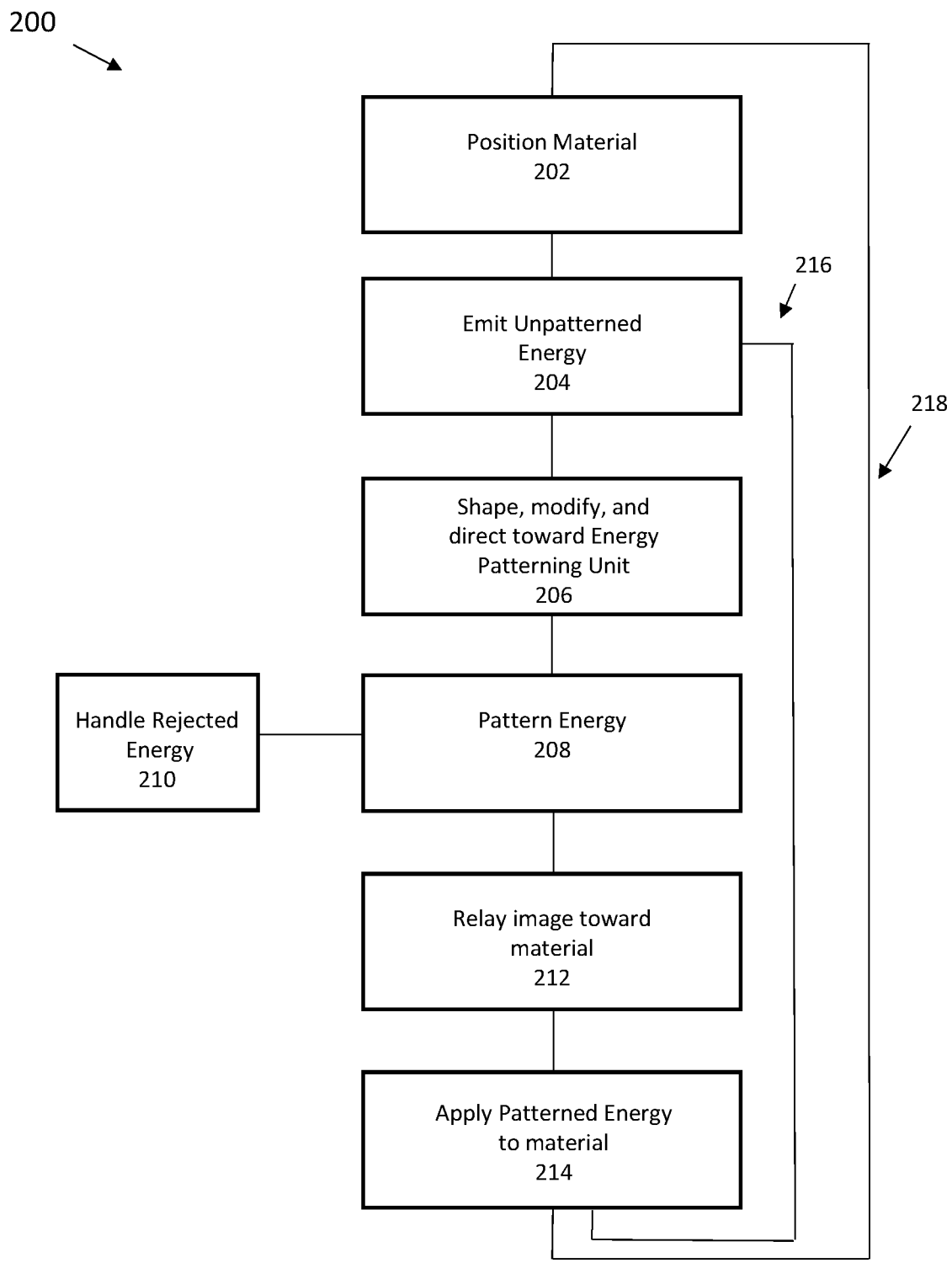
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
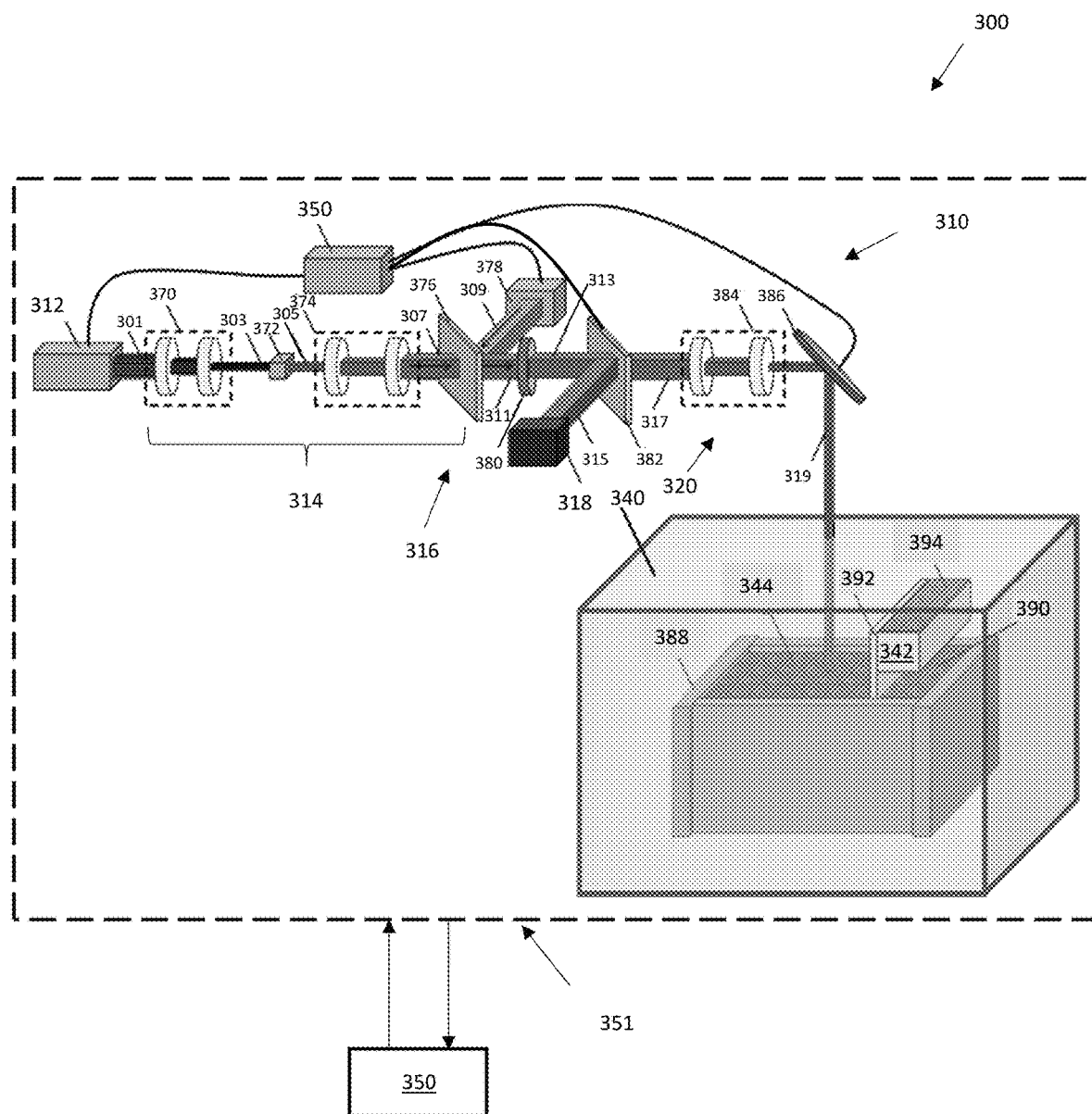
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080 p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
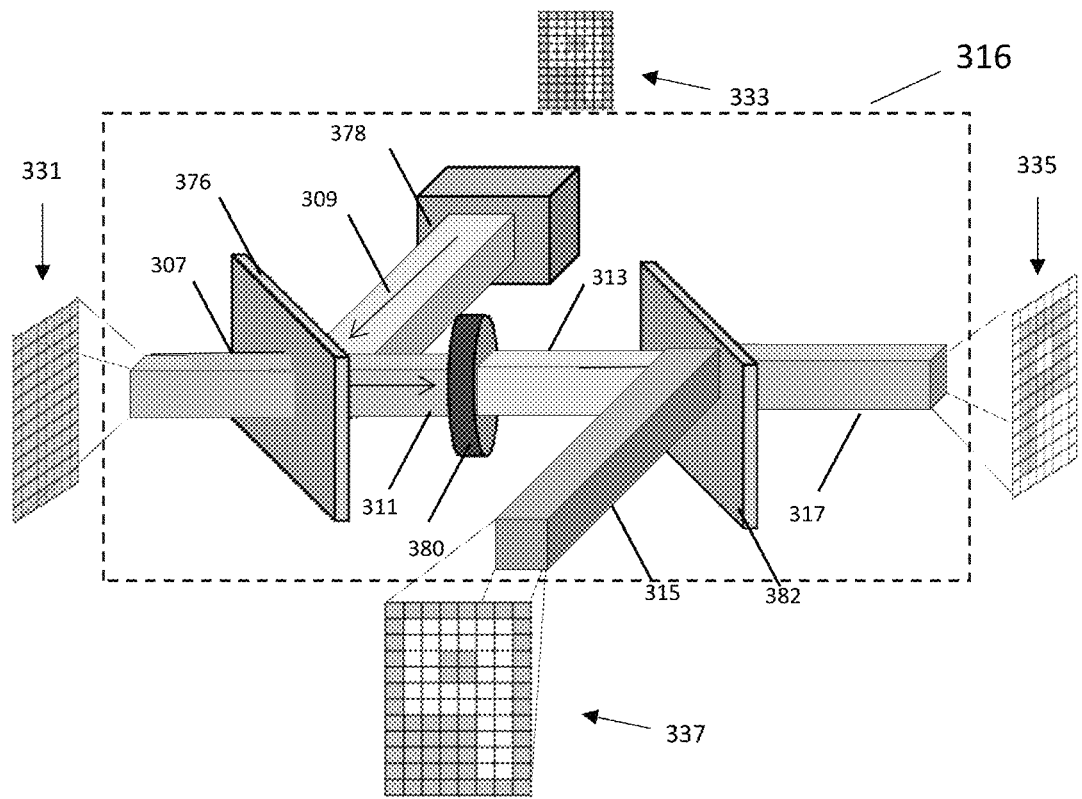
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
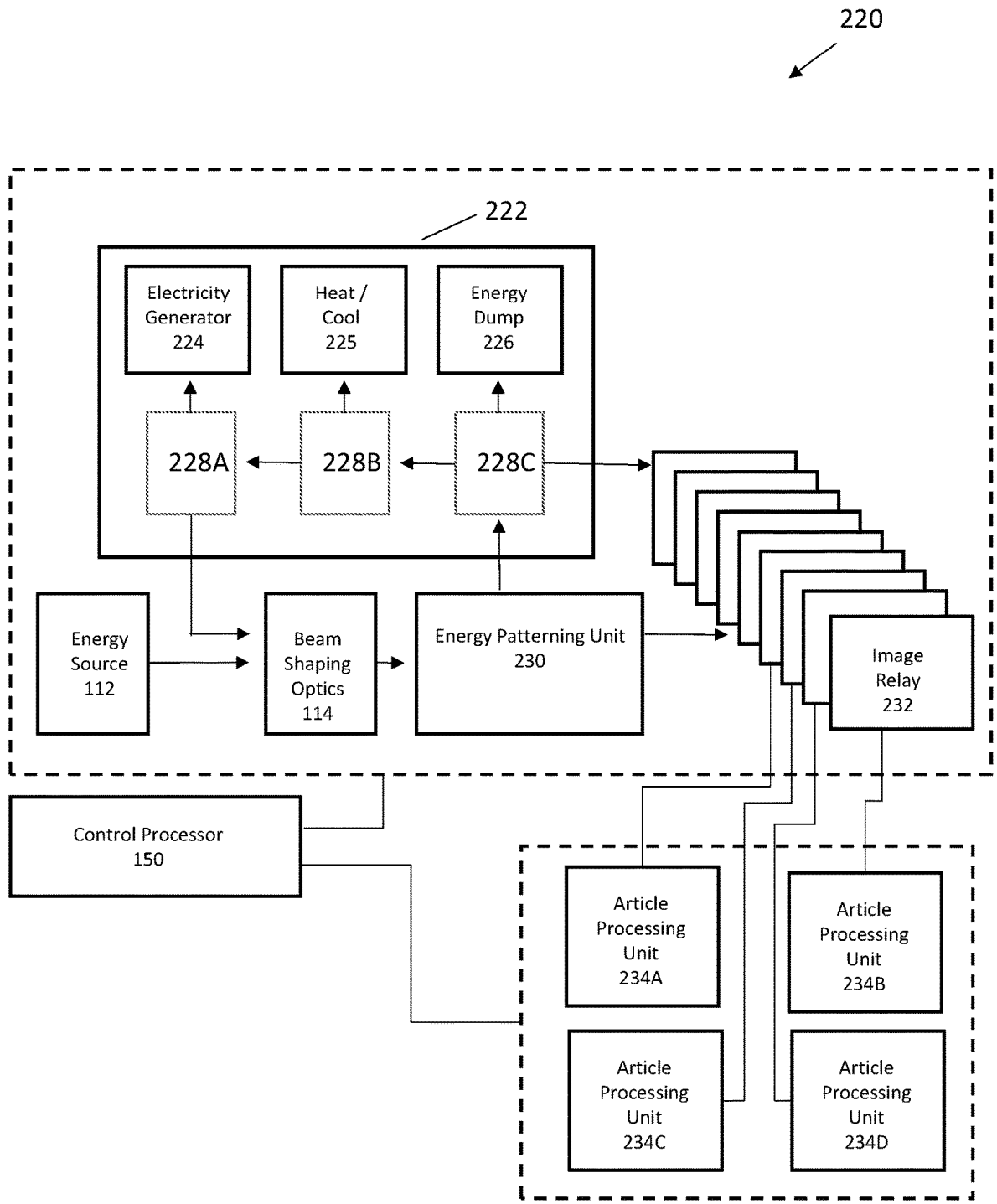
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
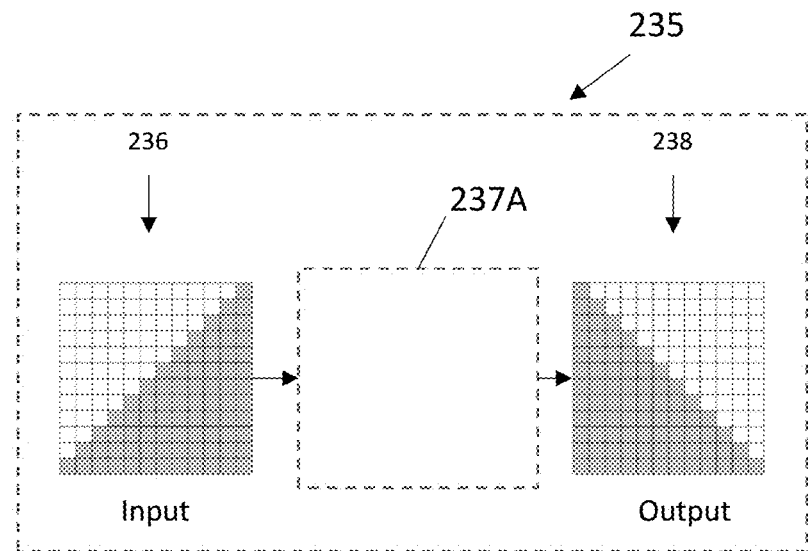
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
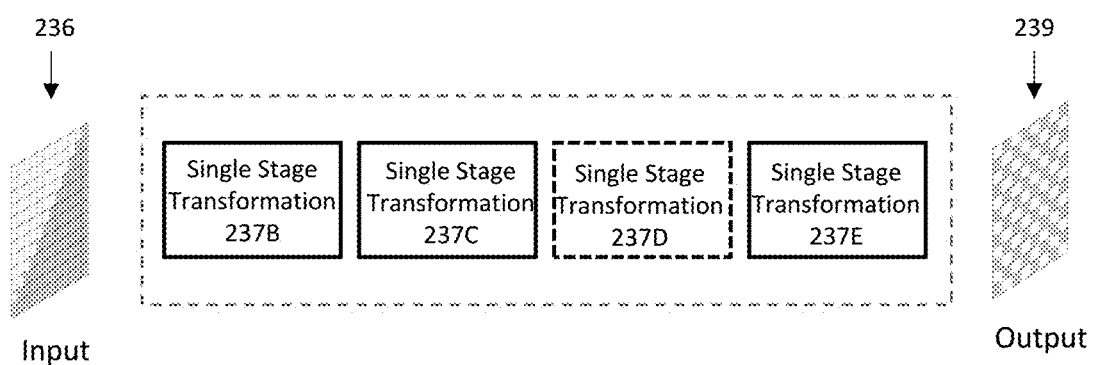
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
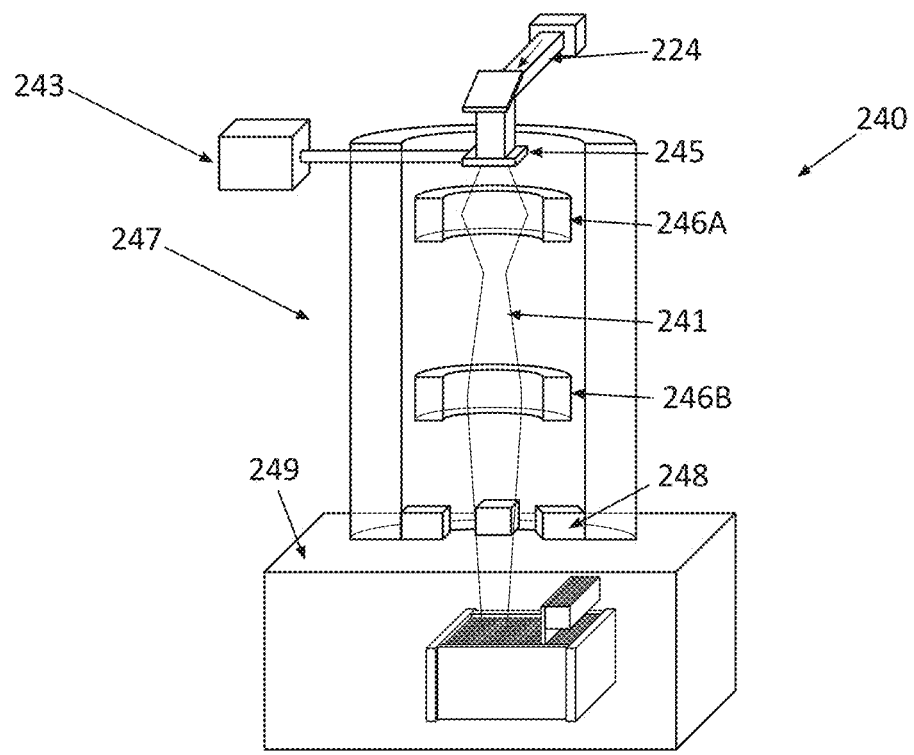
FIG. 3F illustrates an patternable electron energy beam additive manufacturing system.
Figure 3G:
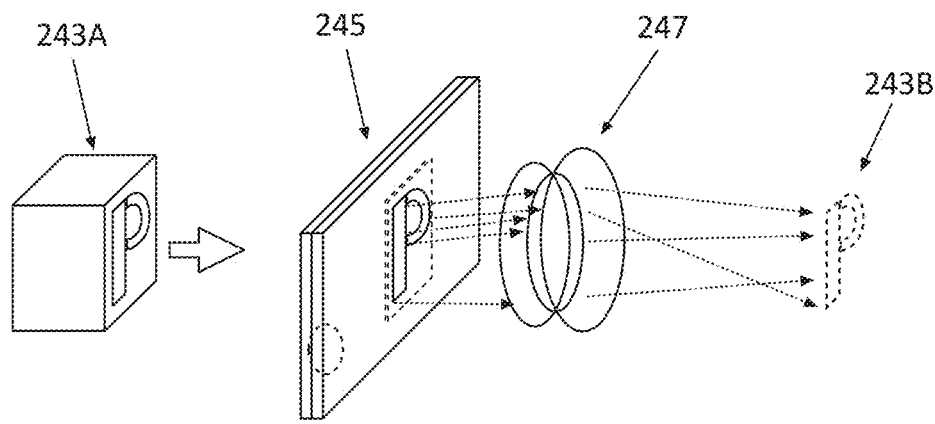
FIG. 3G illustrates a detailed description of the electron beam patterning unit shown in FIG. 3F FIG. 4A-C illustrate various beam combining embodiments.

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal.

Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

Figure 4A:
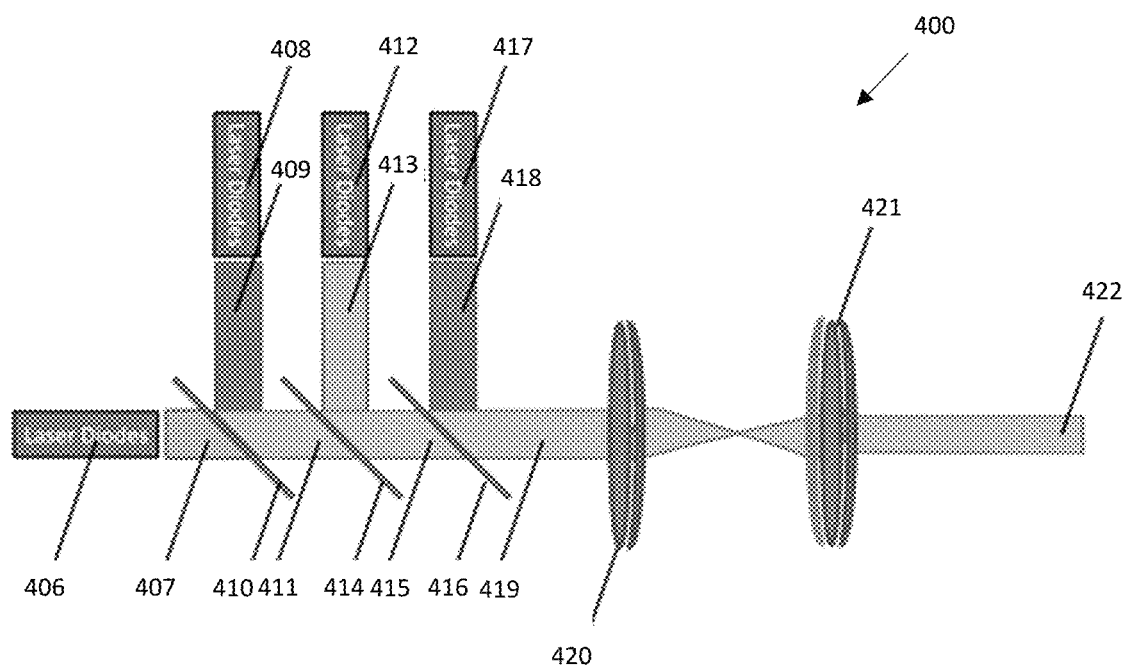

FIG. 4A illustrates a beam combining system 400 having multiple wavelength semiconductor lasers and using transmissive imaging optics. As will be understood, the discussed laser powers and wavelengths are exemplary, as are the selected wavelengths reflected or transmitted by wavelength filters. With the appropriate changes in positioning and use of wavelength filters, greater or lesser numbers of lasers can be used. In certain embodiments, solid state lasers can be substituted or used in combination with semiconductor lasers. In other embodiments, other laser types such as discussed with respect to FIG. 1, including gas, chemical, or metal vapor lasers can be used. In one embodiment, recycling and reuse of rejected light can substitute for a laser. Rejected light available in an additive manufacturing system can be collected, homogenized and re-introduced into a beam line. Advantageously, recycling and re-using rejected light can increase beam intensity and reduce energy costs associated with the system.

In FIG. 4A, semiconductor lasers of a first wavelength (1020 nm) 406 emit a 33.3 kW beam of photons of a corresponding wavelength 407, semiconductor lasers of a second wavelength (1000 nm) 408 emit a 33.3 kW beam of photons of the corresponding wavelength 409, which are then combined using a wavelength filter 410 that transmits 1020 nm photons, but reflects 1000 nm photons. This results in a combined two-wavelength beam 411 of 66.6 kW. Semiconductor lasers of a third wavelength (980 nm) 412 emit a 33.3 kW beam of photons of the corresponding wavelength 413 which are then combined with beam 411 using a wavelength filter 414. Wavelength filter 414 transmits 1020 and 1000 nm, but reflects the 980 nm beam, resulting in a three-wavelength beam 415 of 99.9 kW. Semiconductor lasers of a fourth wavelength (960 nm) 417 emit a 33.3 kW beam of photons of the corresponding wavelength 418 which are then combined with beam 415 using a wavelength filter 416 that transmits 1020 nm, 1000 nm, and 980 nm photons, but reflects 960 nm, resulting in a four-wavelength beam 419 of 133.2 kW. This beam enters the optical imaging system with beam dimensions, for example, of 20 mm×20 mm and a divergence of 1.1 degrees at lenses 420. Lenses 420 are a series of lenses that use two materials, C79-79 and ULE 7972, each having a different index of refraction, to cancel out the effect of wavelength variance on the ability to image the beam. The beam exits the optical system at 421, which is a series of lenses that utilizes three materials, ZeruDur, ULE 7972, and C79-79 to cancel out the effect of wavelength variance on the ability to image the beam. The beam at 422 has been increased in intensity as a result of passing through the optical system and is now 6 mm wide×6 mm tall at 3.67 degrees of divergence resulting in an intensity of 370 kW/cm$^2$, sufficient for the additive manufacturing processing of metals such as powdered stainless steel.

Proper selection of lens material is necessary for best performance. Transmissive optics such as lenses 420 can be made with fused silica glass. This reduces thermal expansion problems due to extremely low coefficients of absorption at wavelengths near 1000 nm, and reduces thermal expansion of lenses due to the extremely low coefficients of thermal expansion fused silica. The use of fused silica allows for the optics to withstand much higher intensities without heating up and expanding which can lead to fracture, changes in the glass index of refraction, changes in glass shape, and consequent changes in focal points. Unwanted optical changes can also be reduced by use of two or more materials. Each material can have a different index of refraction which changes differently with wavelength. Used in the appropriate combination, the changes in index and optical path length cancel out, and there no variance in focal distance as a function of wavelength.

Figure 4B:
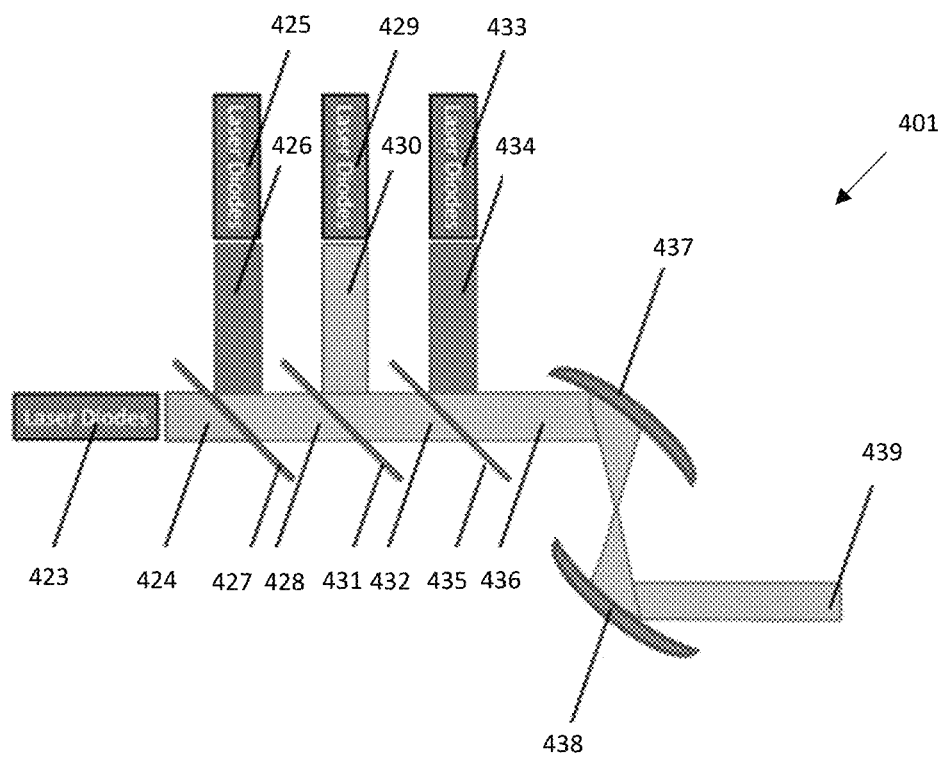

FIG. 4B illustrates an alternative beam combining system 401 that includes a combination of multiple wavelength semiconductor lasers and uses reflective imaging optics to reduce the foregoing discussed issues associated with transmissive optics. Like the beam combining system 400 of FIG. 4A, it will be understood, the discussed laser powers and wavelengths in system 401 are exemplary, as are the selected wavelengths reflected or transmitted by wavelength filters. With the appropriate changes in positioning and use of wavelength filters, greater or lesser numbers of lasers can be used. Multiple types of lasers can be used, and in one embodiment, recycling and reuse of rejected light can substitute for a laser. Rejected light available in an additive manufacturing system can be collected, homogenized and re-introduced into a beam line. Advantageously, reflective optics improve problems associated with semiconductor laser chirp (shift of wavelength over time) during startup transients and over their lifetime. The use of reflective optics prevents detuning of diode laser focus due to this effect and does not affect the resolution achieved or imaging capability. In addition, by using reflective optics, wavelength differences caused by variation in laser operating temperature do not affect the resolution or imaging capability.

In FIG. 4B, semiconductor lasers of a first wavelength (1020 nm) 423 emit a 33.3 kW beam of photons of the corresponding wavelength 424, semiconductor lasers of a second wavelength (1000 nm) 425 emit a 33.3 kW beam of photons of the corresponding wavelength 426. These beams are combined using a wavelength filter 427 that transmits 1020 nm photons, but reflects 1000 nm photons, resulting is a two-wavelength beam 428 of 66.6 kW. Semiconductor lasers of a third wavelength (980 nm) 429 emit a 33.3 kW beam of photons of the corresponding wavelength 430. These beams are combined with beam 428 using a wavelength filter 431 which transmits 1020 and 1000 nm, but reflects 980 nm, resulting in a three-wavelength beam 432 of 99.9 kW. Semiconductor lasers of a fourth wavelength (960 nm) 433 emit a 33.3 kW beam of photons of the corresponding wavelength 434. These beams are combined with beam 432 using a wavelength filter 435 that transmits 1020 nm, 1000 nm, and 980 nm photons, but reflects 960 nm, resulting in a four-wavelength beam 436 of 133.2 kW. This beam enters the optical imaging system with, for example, beam dimensions of 20 mm×20 mm and a divergence of 1.1 degrees at reflective optic 437. Reflective optics have no dependence on wavelength and do not affect the ability to image the beam. The beam exits the beam combining optical system 401 at reflective optic 438. The beam 439 has been increased in intensity as a result of passing through the optical system and is now 6 mm wide×6 mm tall at 3.67 degrees of divergence resulting in an intensity of 370 kW/cm$^2$, sufficient for the additive manufacturing processing of metals such as powdered stainless steel.

Figure 4C:
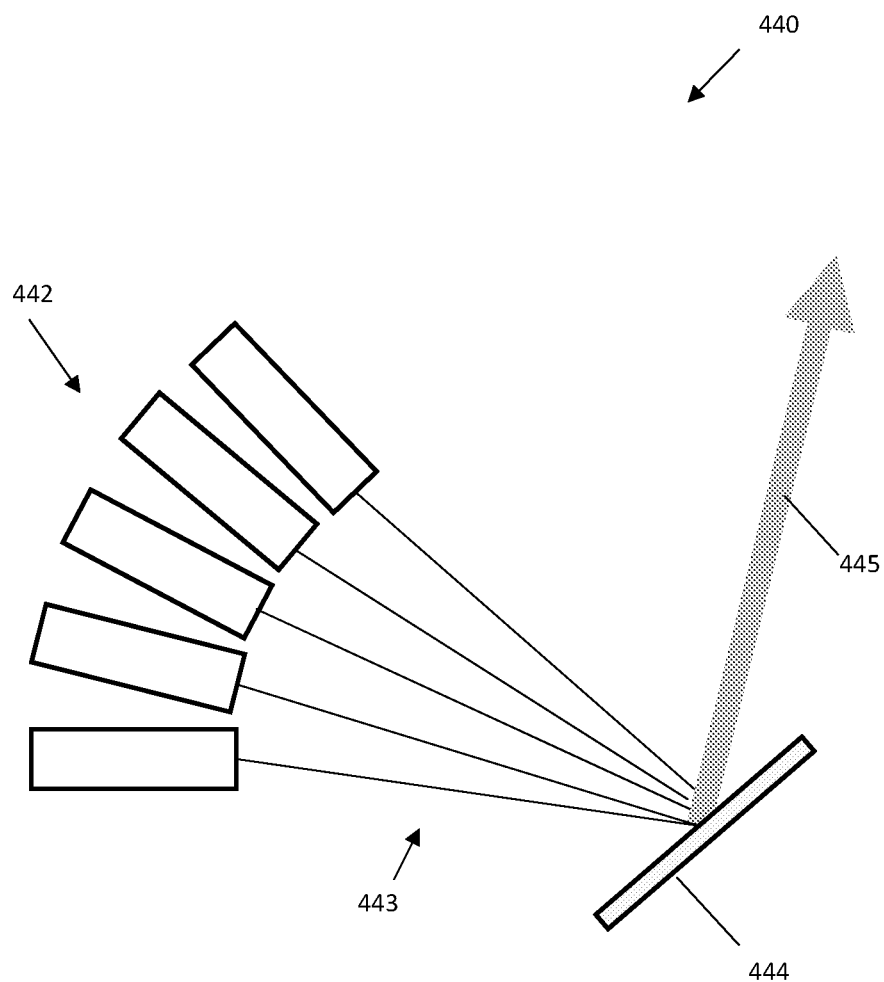

FIG. 4C illustrates an alternative embodiment of a beam combining system 440 that combines beams 443 from same or multiple wavelength lasers 442 using a diffractive imaging optic 444. The diffractive optic can be shaped or patterned to receive beams 443, and reflect them along a substantially same beam axis. As will be understood, while a diffractive optic that reflects beams is shown in FIG. 4C, in other embodiments the diffractive optic can transmit beams, or use a combination of reflective, transmissive, or other suitable beam steering optical assemblies or components.

Figure 5A:
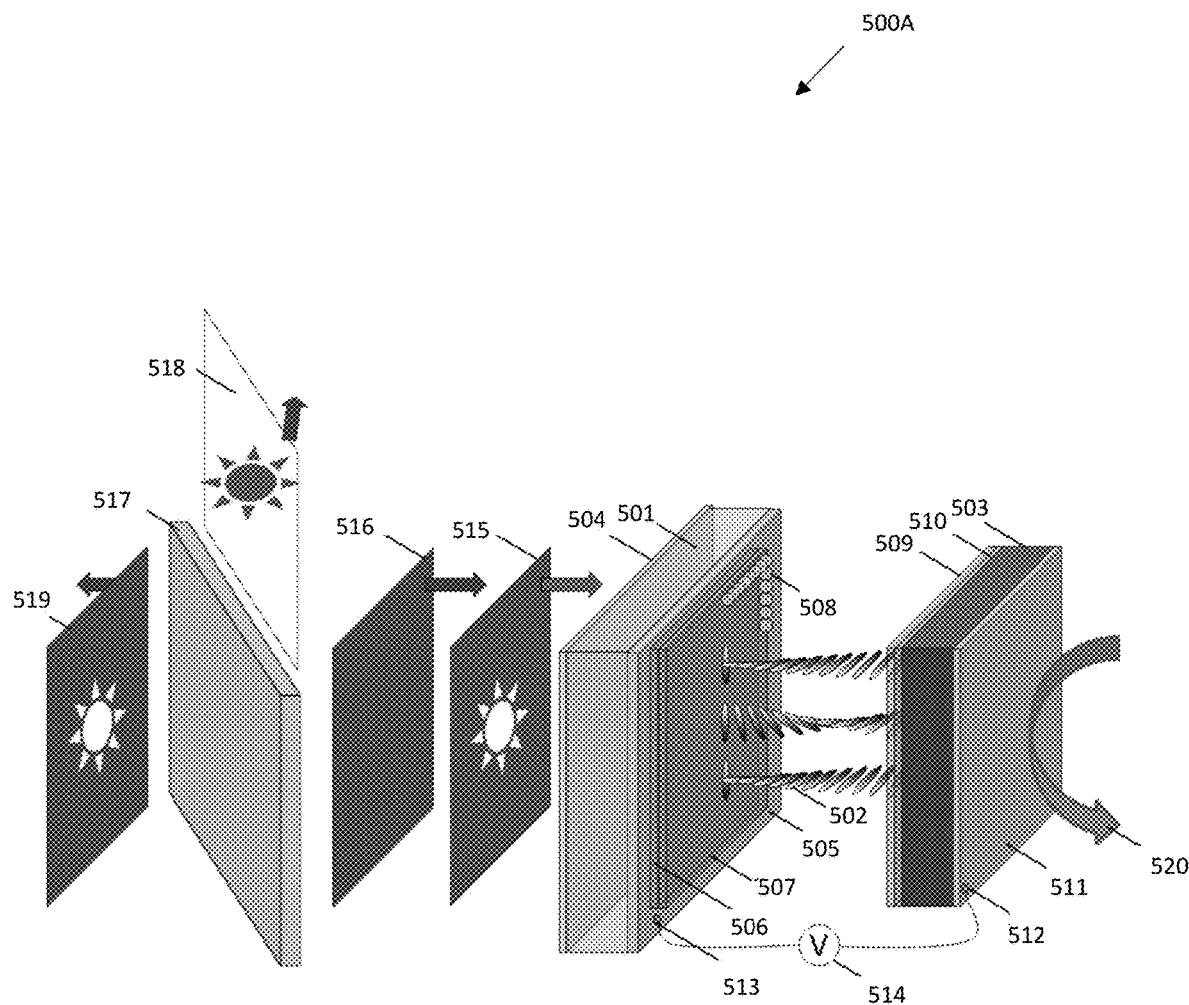
FIGS. 5A-B illustrate reflective light patterning unit embodiments.

FIG. 5A is a reflective optically addressed light valve system 500A useful in additive manufacturing systems such as disclosed herein. Reflective light valves do not need to transmit light through a transparent semiconductor for light patterning, where at high average power levels, even small amounts of absorption can cause unwanted and catastrophic heating. Reflective light valves can also allow for a greater ease of cooling on the reflective surface, with cooling on an opposing side to where the write beam and the read beam are incident.

As seen in FIG. 5A, the reflective optically addressed light valve system 500A is capable of patterning an energy beam and is composed of a highly transmissive layer 501, a twisted nematic (TN) liquid crystal layer 502, and a photoconductor layer 503. The highly transmissive layer is optically transparent for 1000 nm and 700 nm light, made from glass substrate (C79-79 fused silica) 501 which has anti-reflective coatings on both sides at 504 and 506. An Indium Tin Oxide (ITO) conductive coating is applied to highly transmissive layer 501 at 505. Layer 502 is anchored to 506 and 510 by way of anchoring substrates 507 and 509. The exact spacing of 502 is given by the size of the spacer balls 508 which define a gap of 2.5 microns, tuned for maximum contrast ratio when passing 1000 nm light in a double pass. Layer 503 is made of a single crystalline silicon semiconductor with a high reflection dielectric coating applied at 510 which is transparent to 700 nm, but reflective at 1000 nm. Layer 511 is another layer of ITO which has a solder point attached 512 and is connected to layer 505 by way of an AC voltage source 514 by way of another solder point 513. A patterned write beam of light is emitted from a projector source at 700 nm and is incident on 503 after transmitting through 504, 501, 505, 506, 507, 502, 509 and 510. Where the write beam strikes 503 electrons move from the valence band to the conduction band, greatly increasing the local electrical conductivity of 503, allowing current to flow from 511 through 503, 510, 509, 502, 507, and 506 to 505. As current flows through the TN liquid crystal 502, it induces rotation in the liquid crystal 502 causing polarization rotation in transmitted light. The "read" beam 516 is p-polarized and is incident on 510 after transmitting through 504, 501, 505, 506, 507, 502, and 509 at which point it reflects and transmits back through 509, 502, 507, 506, 505, 501, and 504 to exit the light valve system 500A. This beam is then incident on a polarizer 517 which reflects s-polarization resulting in reflected beam 518 and transmits p-polarization resulting in transmitted beam 519. Even though absorption is very low in the device the HR coating 509 is not perfectly reflecting and some energy is absorbed. This energy is removed by radiative, conductive, or convective cooling 520.

Figure 5B:
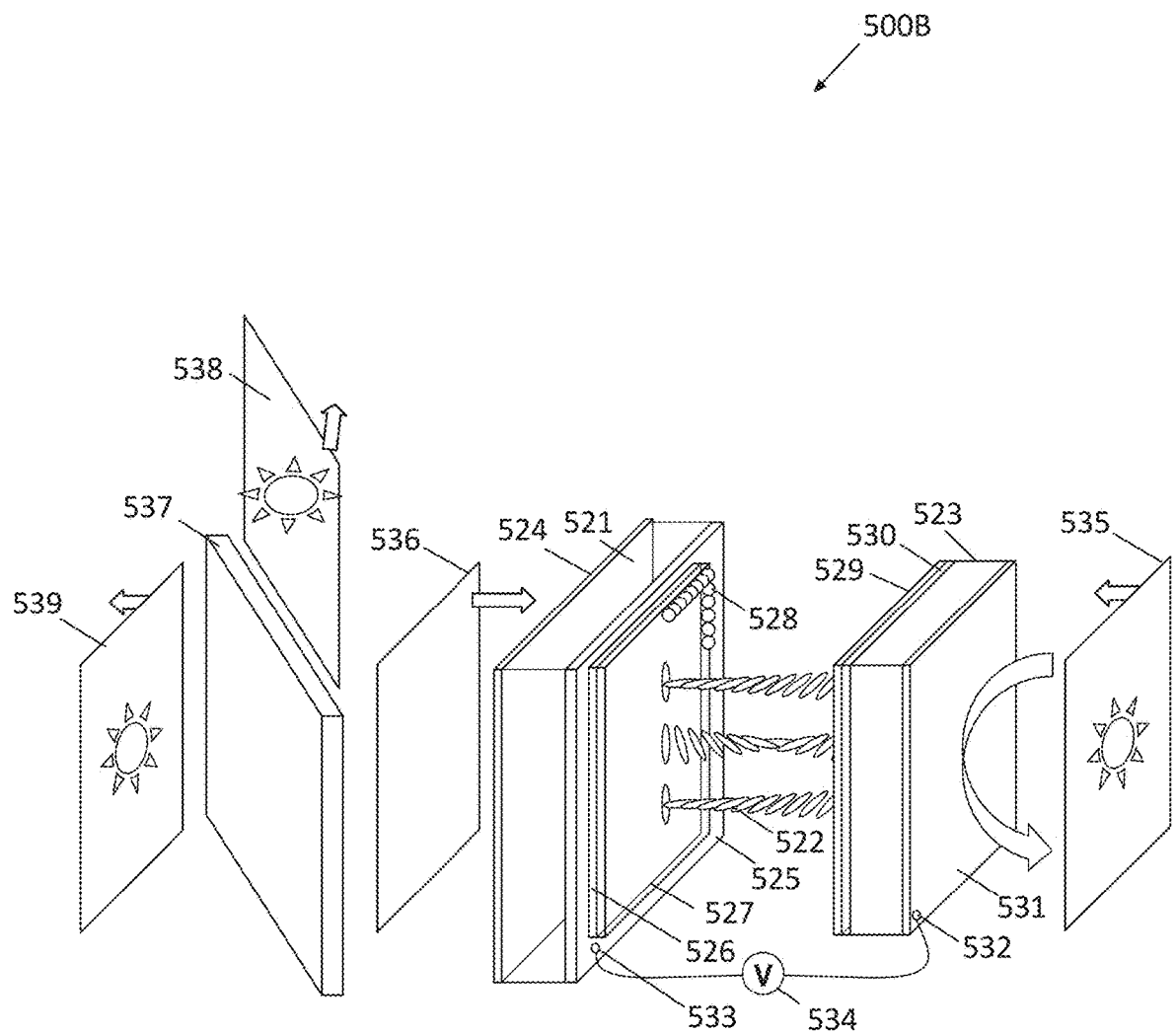

FIG. 5B illustrates an alternative reflective optically addressed light valve 500B with cooling on one side where the write beam and the read beam are incident from the different sides. The valve is composed of a highly transmissive layer 521, a twisted nematic (TN) liquid crystal layer 522, and a photoconductor layer 523. The highly transmissive layer is optically transparent for 1000 nm and 700 nm light, made from glass substrate (C79-79 fused silica) 521 which has anti-reflective coatings on both sides at 524 and 526. An Indium Tin Oxide (ITO) conductive coating is applied to 521 at 525. Layer 522 is anchored to 526 and 530 by way of anchoring substrates 527 and 259. The exact spacing of 522 is given by the size of the spacer balls 528 which define a gap of 2.5 microns, tuned for maximum contrast ratio when passing 1000 nm light in a double pass. Layer 523 is made of a single crystalline silicon semiconductor with a high reflection dielectric coating applied at 530 which reflective at 1000 nm. Layer 531 is another layer of ITO which has a solder point attached 532 and is connected to layer 525 by way of an AC voltage source 534 by way of another solder point 533. A patterned write beam of light is emitted from a projector source at 700 nm and is incident on 523 after transmitting through a an optional convective/conductive substrate 540 and through the ITO coating 531. Where the write beam strikes 503 electrons move from the valence band to the conduction band, greatly increasing the local electrical conductivity of 523, allowing current to flow from 531 through 523, 530, 529, 522, 527, and 526 to 525. As current flows through the TN liquid crystal 522, it induces rotation in the liquid crystal 522 causing polarization rotation in transmitted light. The "read" beam 536 is p-polarized and is incident on 530 after transmitting through 524, 521, 525, 526, 527, 522, and 529 at which point it reflects and transmits back through 529, 522, 527, 526, 525, 521, and 524 to exit the light valve. This beam is then incident on a polarizer 537 which reflects s-polarization resulting in reflected beam 538 and transmits p-polarization resulting in transmitted beam 539. Even though absorption is very low in the device the HR coating 529 is not perfectly reflecting and some energy is absorbed. This energy is removed by radiative, conductive, or convective cooling 540.

To aid better understanding and appreciation of the various system embodiments, including alternative or additional optical systems, chamber designs, powder handling systems and methods, structure formation, part creation and manipulation, use of multiple additive manufacturing systems, and high throughput manufacturing methods suitable for automated or semi-automated factories; the following disclosure will aid in understanding and appreciation of various novel aspects of the disclosed systems, methods, and structures.

Figure 6:
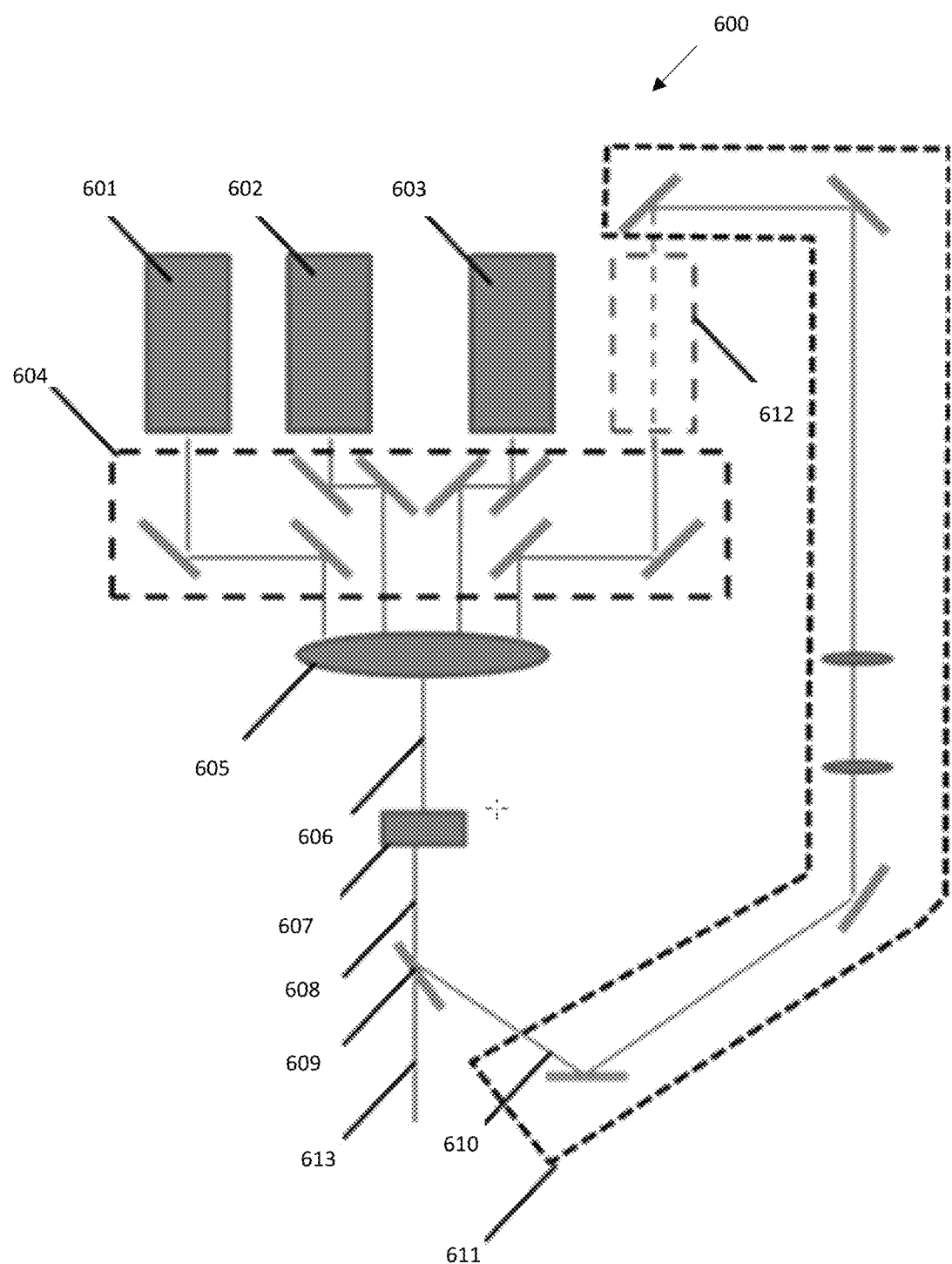
FIG. 6 illustrates light recycling.

FIG. 6 illustrates a layout of an example apparatus 400 for laser light recycling in the additive manufacturing process. Apparatus 600 may include one or more light sources such as, for example and without limitation, light sources 601, 602, and 603. In some embodiments, light sources 601, 602, and 603 may include lasers. Alternatively, other types of light sources such as solid state lasers may be utilized. In some embodiments, each or at least one of light sources 601, 602, and 603 may emit 11.1 kW of p-polarized light at 700 nm, having a size of 7.9 cm×7.9 cm, and 7.6 mrad in divergence. Beams of light emitted by light sources 601, 602, and 603 may be multiplexed together by a first optical assembly 604, which may include a series of mirrors, thus allowing the beams to be as close together as possible. These beams are then reshaped and blended by an optical device 605, resulting in a beam 6, 33.3 kW, 4.7 cm×4.7 cm and 70.4 mrad in divergence. Beam 606 may then be incident on a spatial polarization valve 607, which can apply a spatial polarization pattern map on beam 606 by rotating the polarization of selected pixels from p-polarization to s-polarization to provide a beam 8. With suitable modifications, the selected pixels can be formed by rotating from s-polarization to p-polarization to provide the beam. In still other embodiments, grey scale pixels can be created by partial rotations. Upon interaction with a polarizer 609 the s-polarization state of beam 608 may be reflected into a beam 610. The exact fraction may be given as a function of the fraction of light that is patterned by a spatial polarization valve 607. Beam 10 may enter a second optical assembly 611, which may include a series of mirrors, re-shaping lenses, waveplates, or other optical components, and may be modified into a 7.9 cm×7.9 cm beam and then re-introduced to the system as if it were a light source 612, along with the original one or more light sources 601, 602, and 603.

A process for light recycling can include the steps of multiplexing multiple beams of light including at least one or more beams of light from one or more light sources 601, 602, and 603. The multiple beams of light can be reshaped and blended to provide a first beam of light. A spatial polarization valve 607 of apparatus 600 applies a spatial polarization pattern on the first beam of light to provide a second beam of light. A polarizer 609 of apparatus 600 splits polarization states of the second beam of light 608 to reflect a third beam of light (e.g., beam 610). A second optical assembly 611 of apparatus 600 reshapes the third beam of light into a fourth beam of light, and the fourth beam of light is introduced to first optical assembly 604 as one of the multiple beams of light to result in a fifth beam of light (e.g., beam 613) that is emitted through and not reflected by polarizer 609.

Figure 7:
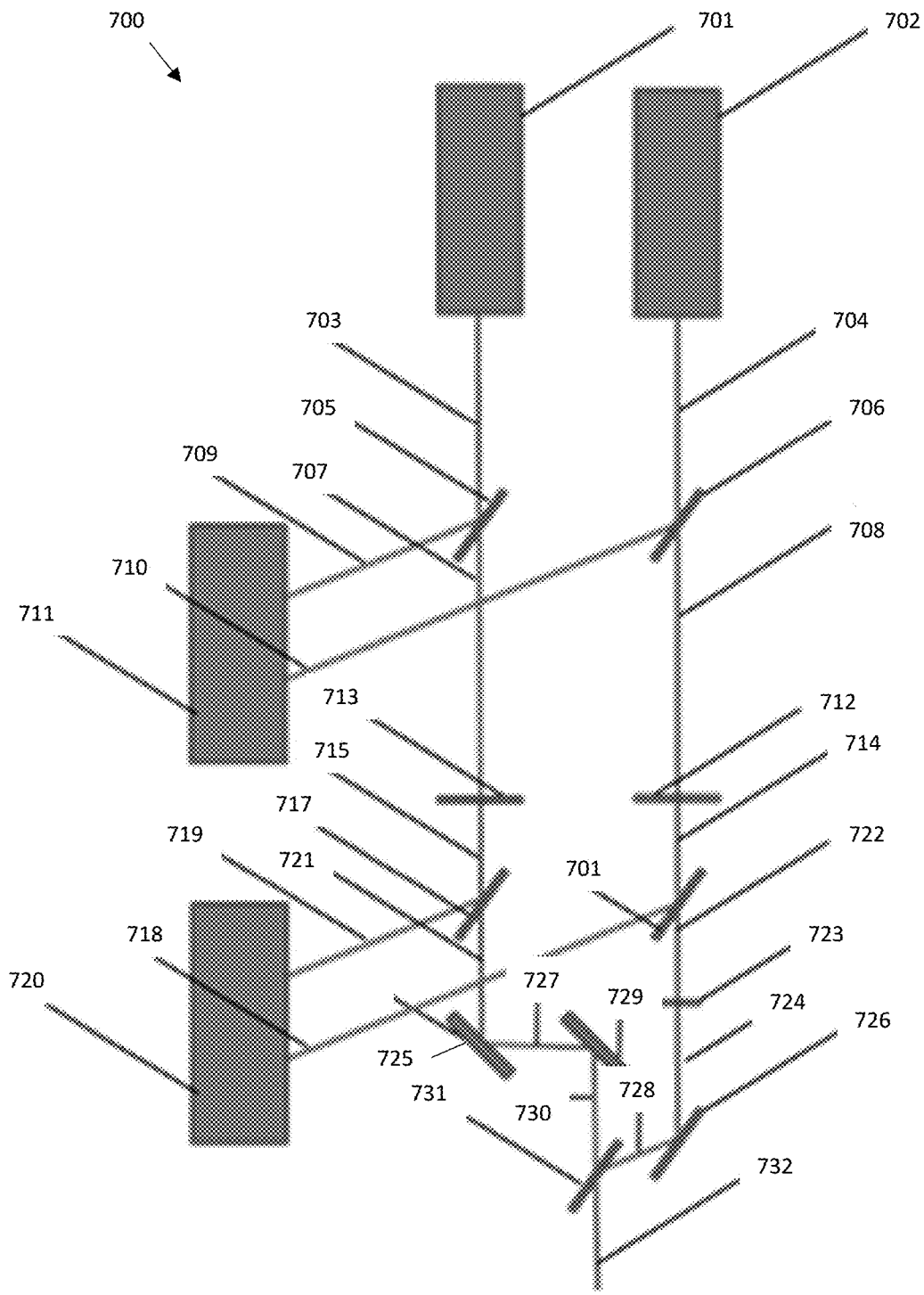
FIG. 7 is a polarized beam system.

FIG. 7 illustrates an example optical assembly 700 of polarization combining to achieve up to 2× of the original semiconductor laser intensity (in the limit) in accordance with the present disclosure. Semiconductor lasers are typically polarized to about 70-90% in one polarization state. When using a polarization rotating method to pattern the light, the 10-20% of the light in the undesired polarization state could potentially go unused (rejected). To avoid this loss, polarization combining and patterning can be used to either boost transmission efficiency or increase resultant intensity by a factor of 2, or both.

In one embodiment, two or more beams of light with a first intensity are provided, each of the two or more beams of light being polarized and having a majority polarization state and a minority polarization state. A respective polarization pattern is applied on the majority polarization state of each of the two or more beams of light and the two or more beams of light are combined to provide a single beam of light with a second intensity greater than the first intensity. In a second embodiment, more than one laser of an arbitrary polarization state can be used. A polarizer is used to split the beam(s) into its (their) respective polarization state(s), and spatially stack the beam(s) of corresponding polarization state(s) close together by spatial positioning creating two effective beams, with one of each polarization state. These two beams, of different polarization state, are then passed through a light modulator relating to their perspective polarization state, then with a polarization state pattern applied in the beam, and subsequently beam combined by polarization combining. This method uses all light in the process, which allows for higher usage of the laser light, thereby achieving minimal to no losses, due to variance in polarization state, as well as better system efficiency.

Optical assembly 700 may include some or all of those components shown in FIG. 7, to be described as follows. Light sources 701 and 702 are each used as a high power photon source. In some embodiments, light sources 701 and 702 may be semiconductor laser arrays with 33.3 kW of power each, emitting photons at 1000 nm that are shaped and blended into a square beam 20 mm wide×20 mm. Emitted light may be 90% polarized in a majority state p resulting in light beams 703 and 704. The emitted light beams 703 and 704 may be incident on polarizers 705 and 706, respectively. Polarizers 705 and 706 may reflect minority state s-polarization to result in light beams 709 and 7010, which may be incident on a beam dump 7011. Polarizers 705 and 706 may transmit p-polarization to result in light beams 706 and 707, which may be incident on polarization rotating optically addressed light valves 712 and 13, respectively. Each of light valves 712 and 713 may have the same image applied to light beams 706 and 707 to create polarization patterns, and may spatially flip 20% of the "pixels" from p-polarization to s-polarization in the desired patterns resulting in light beams 714 and 715. Beams 714 and 715 may be incident on polarizers 716 and 717, respectively. Polarizers 716 and 717 may reflect s-polarization to result in light beams 718 and 719, respectively, which may contain 20% of the energy and may be dumped to a beam dump 720. Polarizers 716 and 717 may transmit p-polarization to result in light beams 721 and 722. Beam 722 may be incident on a half wave plate 723 which rotates the polarization of every photon by a half wave, thereby turning p-polarization to s-polarization to result in light beam 724. Beams 721 and 724 may be incident on mirrors 725 and 726, respectively, to result in light beams 727 and 728. Beam 727 may be incident on mirror 729 to result in beam 730, which may be incident on polarizer 731 in p-polarization. Beam 728 in s-polarization may be incident on polarizer 731 which may reflect s-polarization of beam 728 and transmit p-polarization of beam 730 to result in light beam 732. Beam 732 may be a beam of twice the intensity of a single polarization state from light source 701 or 702, for a total initial intensity of 1.8× the original due to the 90% initial polarization, and proportionally less that for the 20% of the polarization map image applied at light valves 712 and 713. Total propagated intensity at beam 732 may be 1.44× the initial intensity for a total transmitted power of 47.52 kW emitted. Imaged to the original 20×20 mm square, the final intensity may be 11.88 kW/cm2 if divergence angle is maintained.

In powder bed fusion additive manufacturing, a source image of an optical beam of sufficient energy is directed to locations on the top surface of a powder bed (print surface) to form an integral object when a powdered material is processed (with or without chemical bonding). The resolution (or a pixel size) of an optical system used for powder bed fusion additive manufacturing depends on whether the print surface coincides with the focal plane of the final optics in the optical system, or in term for imaging systems, depending on whether the distance between lenses and image planes for optics performing an imaging operation stays substantially a constant distance for a given lens configuration. To be able to print large objects in powder bed fusion additive manufacturing, accurate control of the image location on the print surface, and distance between lenses is necessary to maintain the resolution or the pixel size on every possible location of the top surface of the powder bed. Different powdered materials may require different intensities or energies of the optical beam as the respective thresholds of bonding energies are different. If a change in the intensity is required when changing the powder type or the powder size distribution, the optical system may need to be shut down for re-installation and re-alignment of the imaging lenses.

Figure 8:
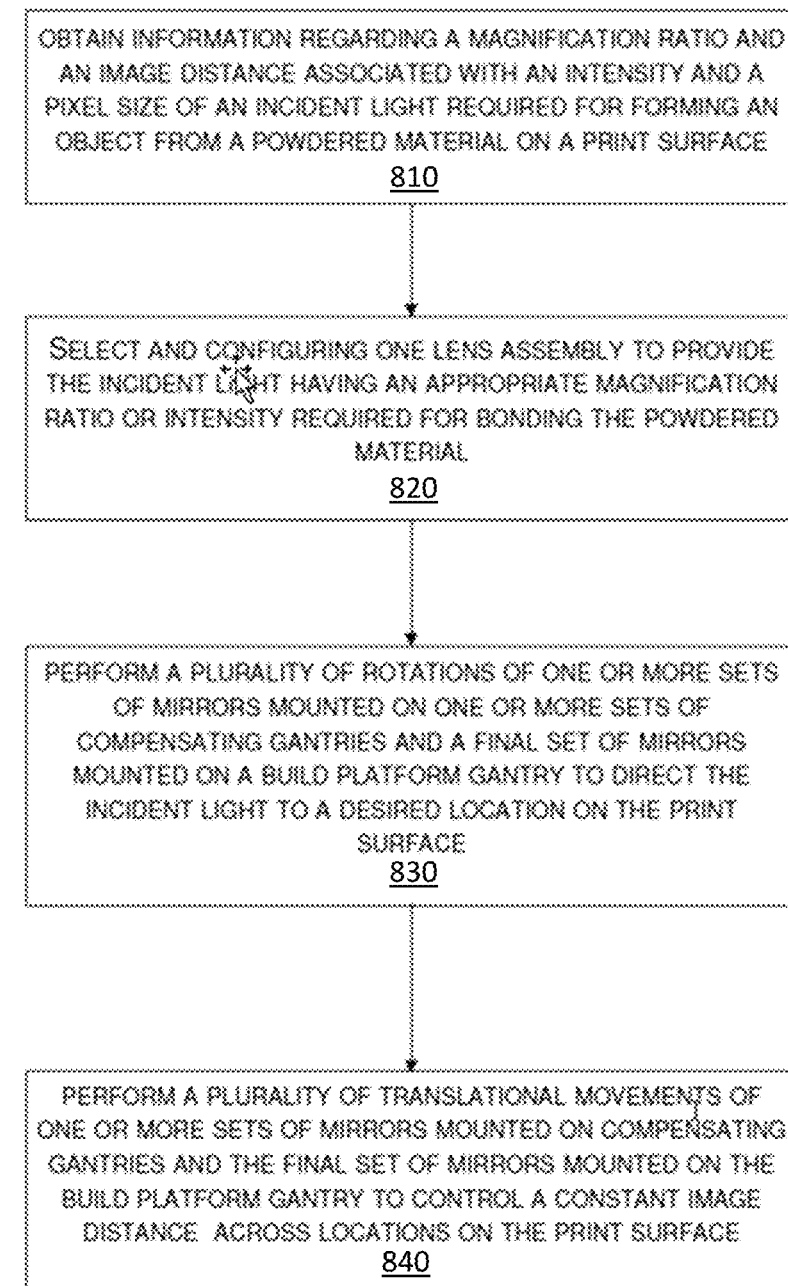
FIG. 8 is a flow chart for magnification changes and gantry movement.

To address the problems related to intensity and resolution changes, a process is described as follows. FIG. 8 is a flow chart 800 illustrating steps for use of a dynamic optical assembly that can include an image relay gantry. In step 810, information is obtained or otherwise determined to find a minimum resolution (a pixel size of an incident light) for an object to be printed in the powder bed fusion additive manufacturing system. According to the intensity and resolution requirements, a magnification ratio of the incident light containing an image information and an image distance of dynamic optical assembly is calculated. The magnification ratio may transfer a first size of the image at a precursor image plane to a second size of the image at the print surface (top surface of a powder bed). The incident light may be originated from energy source and passes through the precursor image plane at which the image information may be created. Process 800 may involve storing geometrical data of the object, positional and rotational control data of the dynamic optical assembly.

At step 820, process 800 can include configuring a mechanical assembly and one or more of lens assemblies to achieve the magnification ratio obtained at 810 suitable for the powdered material. The configuring of mechanical assembly and one of lens assemblies may involve a rotation of mechanical assembly, a swap of second sets of optical lenses, or a removal of a second set of optical lenses.

At step 830, a plurality of rotations can be performed to direct the incident light from the precursor image plane to the print surface at a desired location on the print surface (e.g., top surface of a powder bed) in each successive step of powder bed fusion additive manufacturing. At step 840, the dynamic optical assembly can perform a plurality of translational movements to maintain a constant image distance from the precursor image plane to every location of the print surface (e.g., top surface of a powder bed) in each successive step of powder bed fusion additive manufacturing. Vertical motion of the powder bed or the optical assembly can be used to maintain a fixed separation of the powder bed with respect to a final lens.

An apparatus to implement process 800 can include a layer of a powdered material dispensed on a top surface of a powder bed supported by a build platform. Source image of an incident light located at a precursor image plane is incident upon lens assembly in barrel. Lens assembly may be configured by a rotation of barrel that effect a swap of a second set of optical lenses, a removal of a second set of optical lenses, use of dynamic lenses that change shape, electronic lens swapping, beam redirect systems, electro-optically controlled refractive beam steering devices, or a combination thereof, to have a suitable magnification ratio for the powdered material. Object image of a size different than source image appears after passing through lens assembly, and is modified according to the magnification ratio of lens assembly. The beam containing image information of is incident on precursor mirror and is directed to mirror mounted on compensating gantry where it reflects off mirror and then is incident on final mirror mounted on build platform gantry. Final mirror directs the beam containing image information through a final lens toward a top surface of a powder bed and object image is recreated and magnified in image plane which may be formed thereon. The powdered material on powder bed may melt to form a shape of object image. Build platform gantry then moves to a next location until designated locations on the top surface of powder bed are bonded for that layer. A new layer of the powdered material is dispensed again and the build platform may move down a distance equal to the thickness of the layer of the powdered material to keep a constant distance to the build platform gantry. The cycle starts for the new layer in continuing the additive printing process.

Figure 9A:
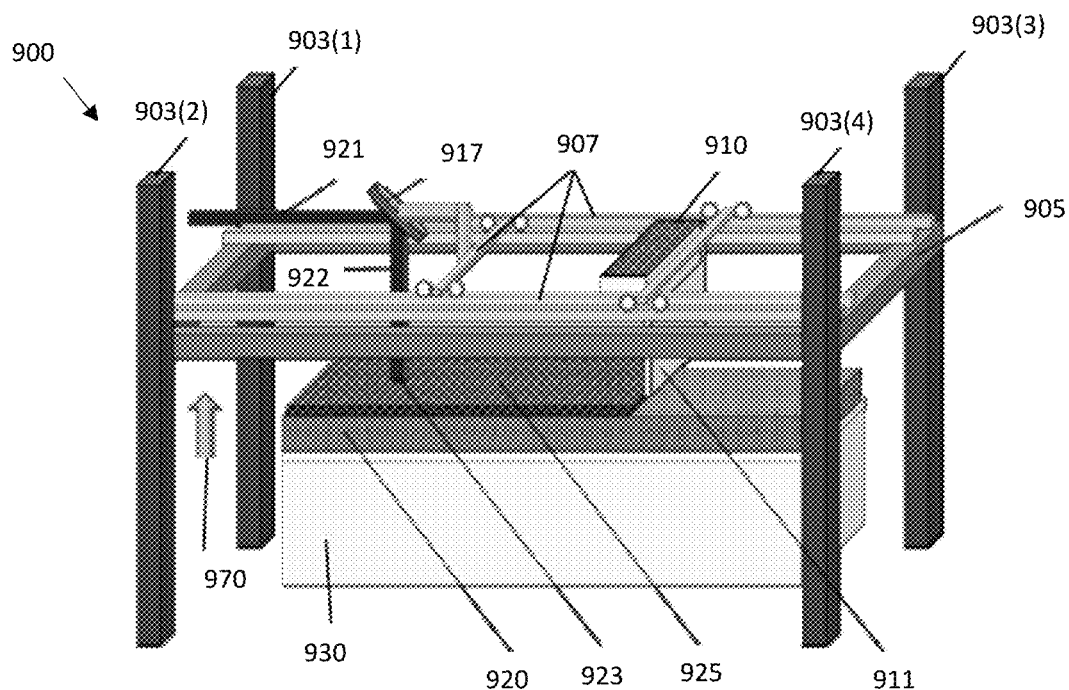
FIGS. 9A-B respectively illustrate a powder bed system and a thermal management system.

FIG. 9A illustrates an example scenario 900 of an intermediate point in a powder bed fusion additive manufacturing printing process in accordance with the present disclosure. Example scenario 800 shows upward movements of components in the build chamber while controlling the depth of field with a stationary build platform 930. Build platform 930 may have an area of 0.5 meter by 1 meter on which powders may be dispensed during a print cycle. In one embodiment, build platform 930 is moved into position beneath gantry table 905 and locked into position. Vertical columns 903(1)-903(4), each of which at a height of 3 meters, support a gantry 907 mounted on the gantry table 905. A powder dispensing unit 910, a compacting functionality 911, and a mirror 917 may be mounted on gantry 907 for translational movements in a horizontal plane. Gantry table 905 is shown at a position higher above powder bed 920 in FIG. 8 to reflect that printing may be in progress. Powder bed 920 contains both powder layers and printed object(s) in various stages of completion. A new layer of powders 925 is dispensed from powder dispensing unit 910 that includes powder spreading and compacting. Beam 921 incident from print head (not shown) may be reflected off a mirror 917 to become beam 922 impinging upon a location 923 in the new layer of powders 925. Printing can occur by melting, sintering, fusing, or otherwise amalgamating of powders at location 923 in the new layer of powders 925. The distance between mirror 917 and the location 923 in the new layer of powders 925 is the depth of field that needs to be tightly controlled to satisfy a resolution requirement. An arrow 970 indicates an upward movement of gantry table 905, which supports gantry 907, powder dispensing unit 910, mirror 917, and in certain embodiments, a surrounding chamber or wall. During this process, the build platform 930 remains locked into place, and the gantry 907 (and/or chamber and chamber wall) moves relative the build platform 930. This arrangement is particularly useful for embodiments discussed below, in which the build platform 930 is large, and will need to support a large amount of heavy material that is not easily moved in a vertical direction with required precision.

In some embodiments, build platform 930 of example scenario 900 may have an area of more than 0.25 square meters. Alternatively, build platform 930 of example scenario 900 may have an area of more than 0.5 square meters. Alternatively, build platform 930 of example scenario 900 may have an area of more than 1 square meters. Alternatively, build platform 930 of example scenario 900 may have an area of more than 5 square meters. Alternatively, build platform 930 of example scenario 900 may have an area of more than 10 square meters. Alternatively, build platform 930 of example scenario 900 may have an area of more than 50 square meters.

In some embodiments, powder bed 920 including the printed object of example scenario 900 may have a mass of more than 10 kilograms. Alternatively, powder bed 920 including the printed object of example scenario 900 may have a mass of more than 50 kilograms. Alternatively, powder bed 920 including the printed object of example scenario 900 may have a mass of more than 100 kilograms. Alternatively, powder bed 920 including the printed object of example scenario 900 may have a mass of more than 500 kilograms. Alternatively, powder bed 920 including the printed object of example scenario 900 may have a mass of more than 1,000 kilograms. Alternatively, powder bed 920 including the printed object of example scenario 900 may have a mass of more than 2,000 kilograms. Alternatively, powder bed 920 including the printed object of example scenario 900 may have a mass of more than 5,000 kilograms. Alternatively, powder bed 920 including the printed object of example scenario 900 may have a mass of more than 10,000 kilograms.

In some embodiments, build platform 930 of example scenario 900 may have an area of more than 0.25 square meters and powder bed 920 including the printed object of example scenario 900 may have a mass of more than 10 kilograms.

Powder bed fusion technique process powdered materials to form integral objects out of metal, ceramic, and plastic powders. Sufficient energies are needed to bring powders to the respective melting/sintering/alloying temperatures, or phase transition temperatures. If a powdered material starts out closer to its phase transition temperature, less energy may be required to complete the phase transition. The powder bed fusion additive manufacturing may benefit from pre-heating of the powder bed to reduce the amount of energy delivered by the lasers or other energy sources. This may allow using a lower intensity laser and less dwell time to bond a powder, increasing the throughput rate.

Post processing heat treatments may be required for some powdered materials such as metals to mitigate stress concentrations and increase mechanical strengths. Post processing heat treatments may include a controlled-temperature anneal or a fast cooling to improve desired mechanical or electrical properties. Pre-heating of powders and post processing heat treatments may be achieved by embedding heating/cooling element(s)/temperature sensor(s) inside walls of a build chamber/inside a build platform and controlling the rate of heating/cooling with a feedback algorithm. Heat loss may be reduced by using insulating materials inside walls of a build chamber.

Figure 9B:
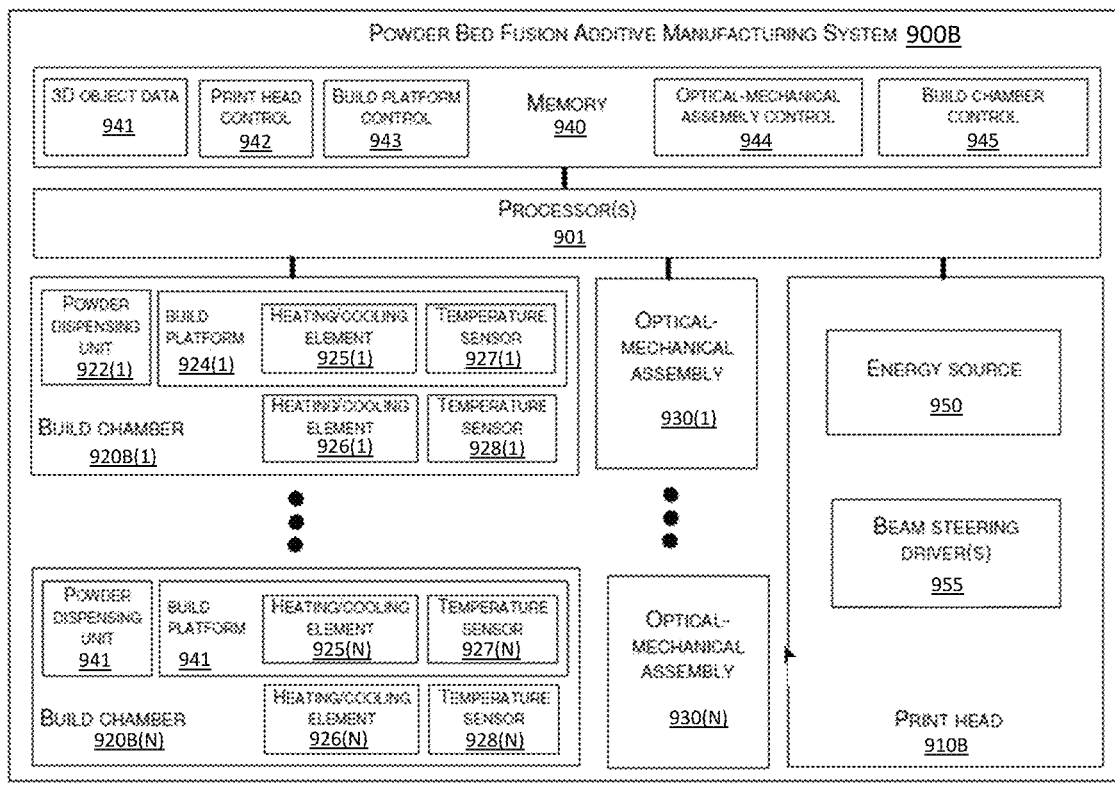

A suitable thermal management system for use in conjunction with the described powder bed and chamber is discussed with respect to FIG. 9B. FIG. 9B illustrates an example apparatus of laser-based powder bed fusion additive manufacturing system 900B in accordance with an embodiment of the present disclosure. The system 900B includes both an energy source 950 and energy beam steering systems/drivers 955 as part of a printhead 910B. An optical-mechanical assembly 930(1)-930(N) can distribute energy beams for the printhead 910B through the system 900B. Data input, monitoring, control, and feedback control using various sensors is enabled by processor(s) 901 and memory 940. These systems can include input of 3D object data 941, print head control 942, build platform control 943, optical-mechanical assembly control 944, and build chamber control 945.

Laser-based powder bed fusion additive manufacturing system 900 may include one or more build chambers. For illustrative purpose and without limitation, one or more build chambers of system 900 are shown in FIG. 9B as build chambers 920B(N), with N being a positive integer greater than or equal to 1. Build chambers 920B(1)-920B(N) may include powder dispensing units 922(1)-922(N) for dispensing powdered materials and build platforms 924(1)-924(N) to support powder beds formed by powdered materials. Each of build chambers 920B(1)-920B(N) may have a different size and may be swappable among each other within powder bed fusion additive manufacturing system 900. Build chambers 920B(1)-920B(N) may have removable doors to facilitate powder removal from a side of build chambers 920B(1)-920B(N) after a build. Build chambers 920B(1)-920B(N) may be sealed in an atmosphere during powder bed fusion additive manufacturing. The atmosphere may include, but not limited to, vacuum, air, nitrogen, argon, or helium.

In some embodiments, walls/ceilings of build chambers 920B(1)-920B(N) may be embedded with heating/cooling elements 926(1)-926(N) and temperature sensors 928(1)-928(N) to control the thermal environment inside build chambers 920B(1)-920B(N).

In some embodiments, heating/cooling elements 926(1)-926(N) may be fluid channels capable of heat exchange. The fluid may be heated or cooled outside build chambers 920B(1)-920B(N) and perform heat exchange with the walls/ceilings by moving fluid through the fluid channels. The fluid may include, but not limited to, an oil, water, steam, air, nitrogen, argon, or a coolant.

In some embodiments, heating/cooling elements 926(1)-926(N) may be resistive heating elements and thermionic cooling elements respectively.

In some embodiments, temperature sensors 928(1)-928(N) may be thermocouples embedded inside walls/ceilings of inside build chambers 920(1)-920(N).

In some embodiments, temperature sensors 928(1)-928(N) may be infrared camera(s) mounted on walls/ceilings inside build chambers 920(1)-920(N).

In some embodiments, each of build chambers 920(1)-920(N) may include radiation shields on walls/ceilings of build chambers 920(1)-920(N) to reduce heat loss.

In some embodiments, build chambers 920(1)-920(N) may include low thermal conductance materials as parts of walls/ceilings.

In some embodiments, each of build platforms 924(1)-924(N) may be capable of vertical motions or being fixed at a given height during powder bed fusion additive manufacturing. Build platforms 924(1)-924(N) may have different sizes and support variable masses of powder beds. Build platforms 924(1)-924(N) may be removable from build chambers 920(1)-920(N) on rails, wheels or other means.

Figure 10:
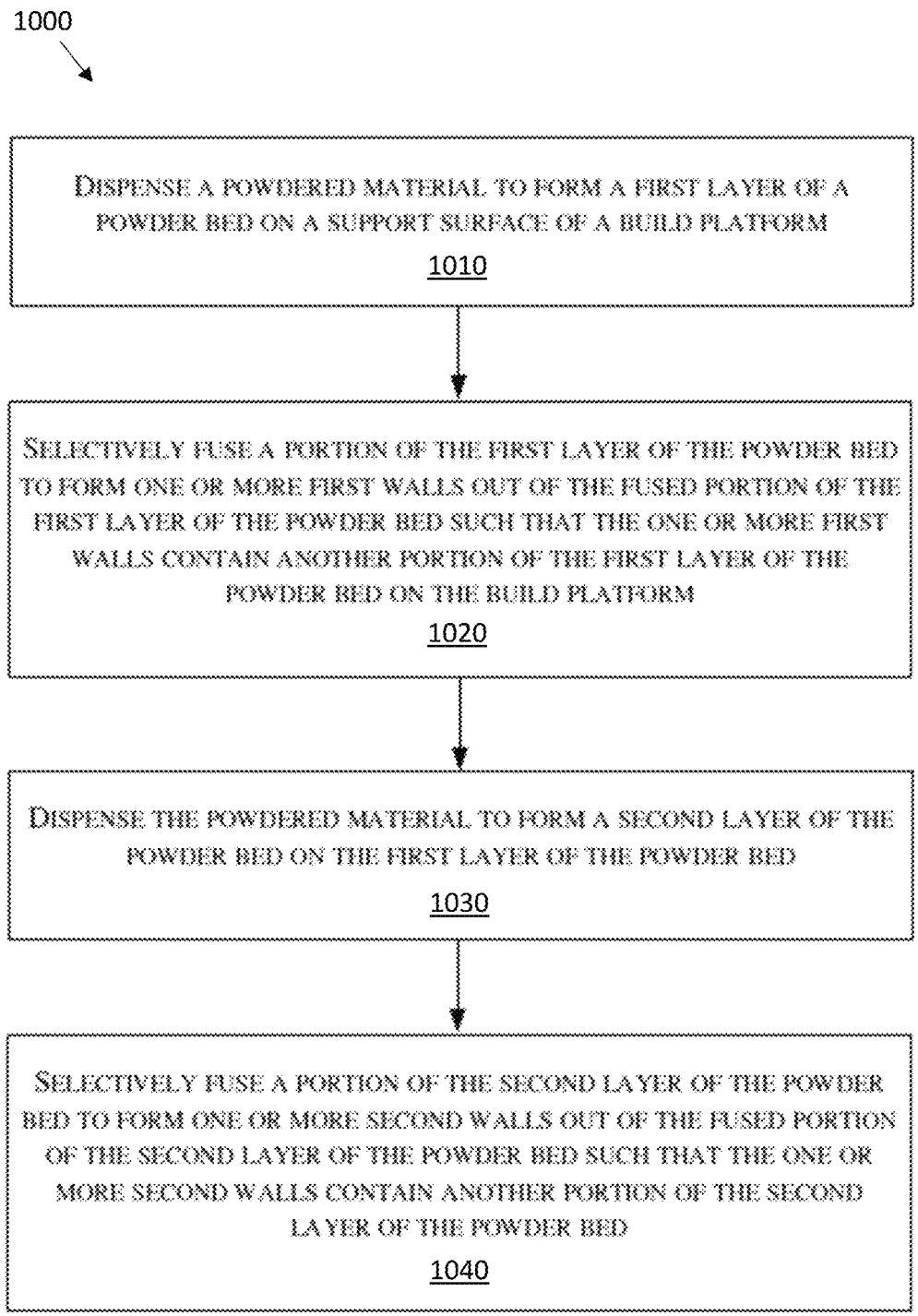
FIG. 10 is a flow chart illustrating additive formation of temporary walls to contain powder.

FIG. 10 describes a method to minimize powder volume requirements during a build operation. Process 1000 may be utilized to realize printing variable print chamber walls for powder bed fusion in a powder bed fusion additive manufacturing system in accordance with the present disclosure. At 1010, process 1000 may involve dispensing a powdered material to form a first layer of a powder bed on a support surface of a build platform.

At 1020, process 1000 may involve selectively fusing a portion of the first layer of the powder bed to form one or more first walls out of the fused portion of the first layer of the powder bed. The one or more first walls may contain another portion of the first layer of the powder bed on the build platform. In some embodiments, the one or more first walls may include multiple walls surrounding an area interior of the build platform to create a region devoid of the powdered material. At 1030, process 1000 may involve dispensing the powdered material to form a second layer of the powder bed on the first layer of the powder bed. At 1040, process 1000 may involve selectively fusing a portion of the second layer of the powder bed to form one or more second walls out of the fused portion of the second layer of the powder bed. The one or more second walls may contain another portion of the second layer of the powder bed.

In some embodiments, the one or more first walls may include multiple first walls surrounding another portion of the first layer of the powder bed over a first area of the build platform. Moreover, the one or more second walls may include multiple second walls surrounding another portion of the second layer of the powder bed over a second area of the first layer of the powder bed, with the second area being smaller than the first area.

In some embodiments, the one or more first walls may include at least one wall along at least one perimeter of multiple perimeters of the build platform. Additionally, the remaining one or more perimeters of the multiple perimeters of the build platform may border one or more structural walls. In some embodiments, process 1000 may further involve causing a relative movement between the build platform and the one or more structural walls in a direction perpendicular to the support surface of the build platform. Moreover, process 1000 may involve dispensing the powdered material on the first layer of the powder bed and the one or more first walls to form a second layer of the powder bed. Furthermore, process 1000 may involve selectively fusing a portion of the second layer of the powder bed to increase a height of the one or more first walls.

In another embodiment, temporary walls can be produced to have pipes, cavities, or porous sections (hereinafter "fluid passageways") able to support fluid flow. The fluid passageways can be open, or partially closed, and can be formed to interface with external pipes, hoses, sprayers, or other fluid communication systems. Air, nitrogen, water, high temperature or silicone oils, or other suitable gas or liquid can be circulated or otherwise transferred through a fluid passageway to improve thermal management. Thermal management can include both fast or controlled cooling, and the fluid can be circulated (e.g. through pipes formed in the temporary walls) or sprayed, dripped, or splashed against, for example, a porous outer wall section.

The proposed scheme may be implemented in powder bed fusion additive manufacturing systems for printing metal, plastic, or ceramic parts. Applications of the proposed scheme may be more specifically defined as for use in the print bed part of the machine on the receiving end of the laser or electron beam. In various embodiments of the present disclosure, one or more energy sources of a print head of a powder bed fusion additive manufacturing system may be controlled to print walls of a build chamber. This allows for elimination of the edge walls of the chamber, and can allow for sub-set areas to be created. The presence of sub-set areas/volumes/voids can help minimize powder usage, and enables the creation of volumes devoid of powder. This is especially useful when working with expensive materials such as gold, silver, and copper, and is also useful for working with very large objects where the excess powder can include a very large portion of the standard print volume. Under the proposed scheme, powder may be selectively distributed across the build area in pre-defined walled areas created during the additive manufacturing process.

Since the print bed and the print head are typically vertically separated for successive layers, there is a need for print chamber walls to support previously deposited layers consisting of powder and printed object(s). One example may involve raising to a close-fitting wall. Another example may involve printing a perimeter wall (and perhaps structural support for it) during each layer. This wall may be cut out and recycled after each print.

In some embodiments, most or all of the surrounding walls may be raised, and a wall may be also printed to lessen the powder bed area for the layer of powder while using a "tub" formed by the surrounding walls for catchment of powder falling outside the printed wall.

In some embodiments, the raised wall may be not intended as a full perimeter. For instance, access points for a fork lift or other material handling equipment may be needed when the print bed is first put into the print station and later when the completed bed (powder and printed object(s)) are lifted out. The printing of a limited wall for this area provides the required remaining wall to support the powder during a print cycle. The material handling equipment potentially can then "punch" through this printed wall to gain access to the lift points. In some embodiments, the lift points may be determined by an algorithm or user placement a priori the build and are built into the walls in key locations.

The printed wall does not need to match geometry of the print table, nor exactly match a wall printed in a previous layer. This allows, with the appropriate powder dispensing equipment and logic, powder to be dispersed just enough to cover between the walled areas where powder is needed. Advantageously, this can save a tremendous amount of time, weight and/or powder per layer.

Figure 11A:
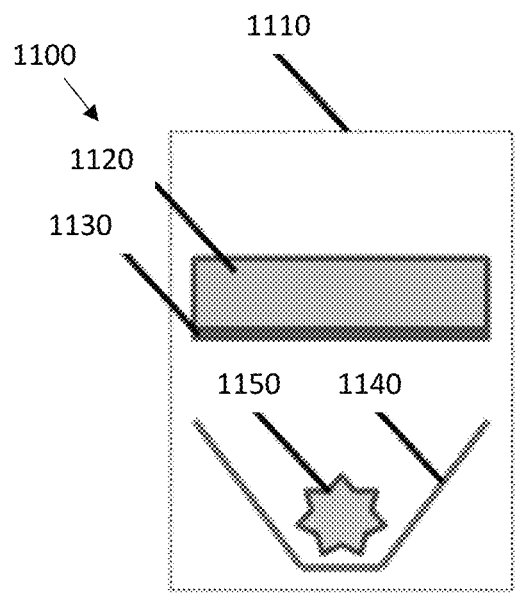
FIGS. 11A-B illustrate embodiments for powder removal.

FIG. 11A illustrates an example scenario 1100 in which a powder bed 1120 is formed on a build platform 1130 in accordance with the present disclosure may be utilized. The build platform 1130 may have an area of 0.25 square meter and may support a powder bed 1120 of a powdered material, which may be 0.5 m deep inside a build chamber 1110. Scenario 1100 may be at the end, or in the middle of a print cycle. Below the build platform 1130 is a hopper 1140 with sloped walls which may be 45-60 degrees relative to a horizontal surface on which build platform 1130 is disposed. In some embodiments, hopper 1140 may contain an auger 1150.

Figure 11B:
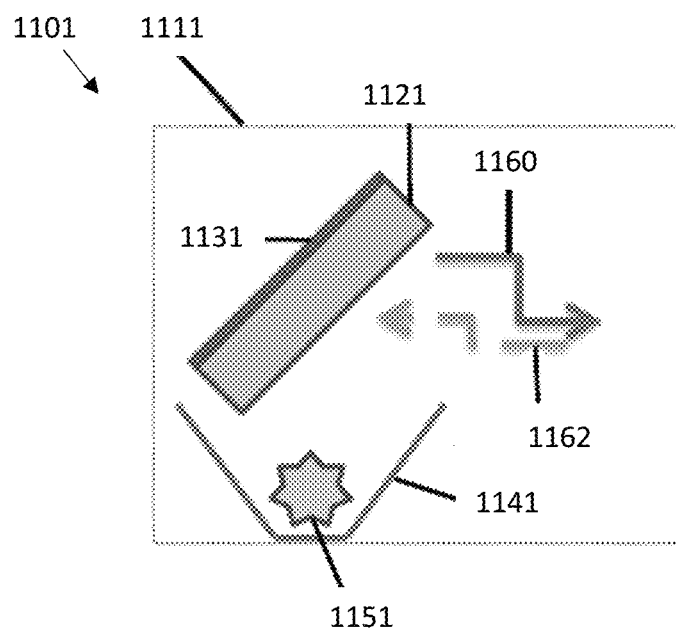

FIG. 11B illustrates another example scenario 1101 in which the separation of a powder bed 1121 from a build platform 1131 is depicted. Scenario 1101 may be at the end of a print cycle or in a mid-cycle that is aborted due to various reasons. Inside a build chamber 1111, a build platform 1131 supporting the powder bed 1121 may be tilted over 90 degrees from a horizontal position. The gravity pull due to the weight of the powder bed 1121 causes the powdered material and the printed object(s) embedded within the powder bed 1121 to fall in a hopper 1141 below. The build chamber 1111 may include a vacuum 1160 and a high pressure jet 1162 so that a substantial portion of powders may be collected in the hopper 1141. The vacuuming 1160 and gas jetting 1162 may be utilized to dislodge sticky powders remained on the build platform 1131 after tilting the build platform 1131. The hopper 1141 may have sloped walls to help guide powders onto the bottom of the hopper 1141. The hopper 1141 may include an auger 1151.

Processing can involve controlling a powder dispensing assembly to dispense a plurality of layers of a powdered material in forming a powder bed during a print cycle. Vertical motion of powder dispensing assembly can be controlled to maintain a constant separation from the powder bed. The vertical motion results in indexing powder dispensing assembly can be away from the powder bed (e.g., upwards) by a distance equivalent to a thickness of a dispensed powder layer after a portion of dispensed powder layer is bonded together. To remove leftover powder, movement of the build platform may include rotating, tilting, inverting, vibrating, shaking and/or jittering. As a result of these motions, the powder bed on build platform may fall into hopper below build platform due to weight of the powder bed. Vacuum systems, mechanical arm, and/or gas sprayer can be used to further dislodge remaining powders on build platform. Thus, a substantial portion of the powdered material may be collected in hopper for reuse or for storage. In some embodiments, an auger and/or conveyer can be used to transport collected powders in hopper towards one or more of storage chambers. In another process embodiment, a substantial portion of the powdered material can be sealed in one or more of storage chambers an atmosphere suitable for the powdered material. The atmosphere may include vacuum, air, nitrogen, argon, helium, other inert gas, or noble gas.

Figure 12A:
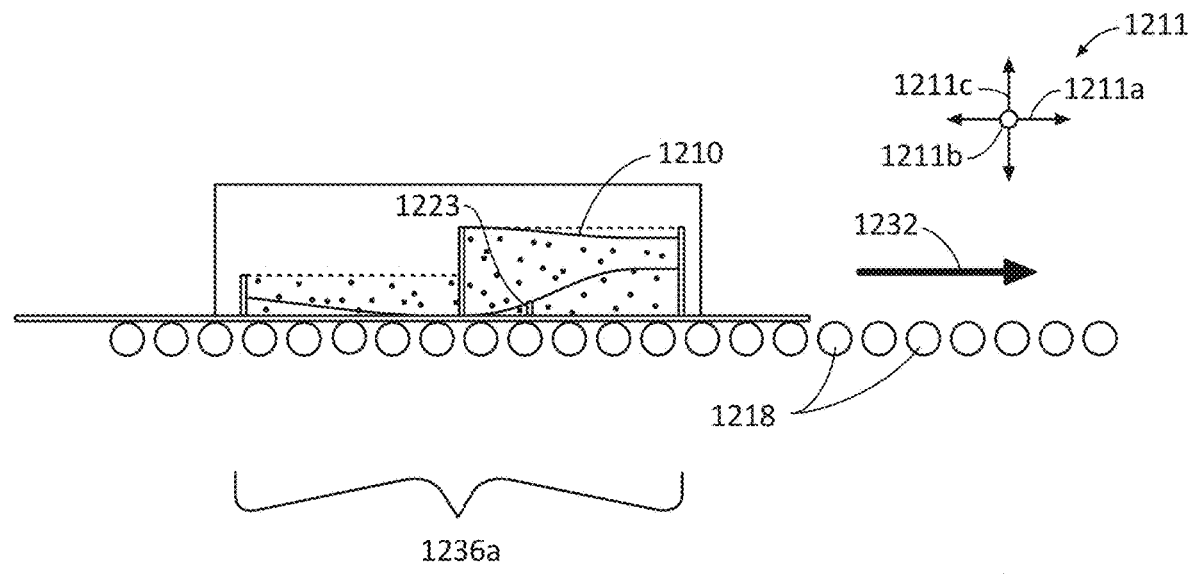
FIGS. 12A-B illustrate long part manufacture with multiple zones.
Figure 12B:
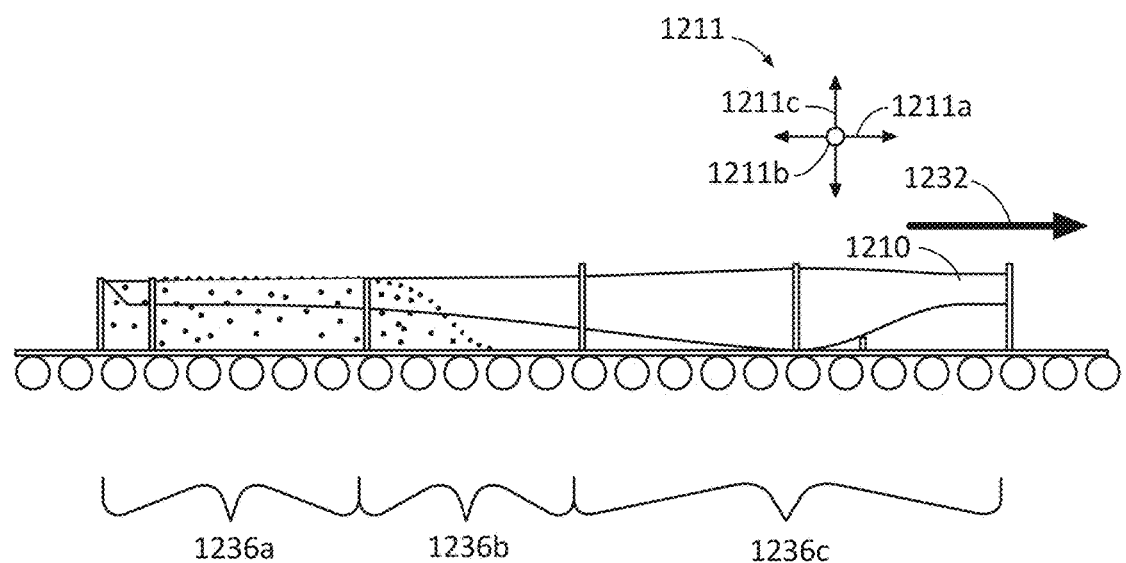

FIGS. 12A and 12B illustrates a system for long part manufacture. Many current 3D printers have significant and recurrent downtime when a build chamber must be emptied of powder and printed parts and reset for the next print job. In the following description, a uniform coordinate system 1211 is defined. Accordingly, certain systems may correspond to or define longitudinal, lateral, and transverse directions 1211a, 1211b, 1211c that are orthogonal to one another. The longitudinal direction 1211a may correspond to a long axis of a system. Accordingly, during additive manufacture, a long axis of a long part 1210 may be substantially aligned with the longitudinal direction 1211a. The lateral direction 1211b may combine with the longitudinal direction 1211a to define a horizontal plane. That is, the longitudinal and lateral directions may both extend within a horizontal plane. The transverse direction 1211b may extend up and down in alignment with gravity.

In selected embodiments, systems and methods in accordance with the present invention may enable or support substantially continuous additive manufacture that does not have such downtime. As can be seen with reference to FIGS. 12A and 12B, this may be accomplished by manufacturing a part 1210 in segments. For example, a system can (1) manufacture a first segment 1212a of a part 1210, (2) advance the part 1210 a selected distance down a conveyor 1216, (3) manufacture a second segment 1212b of the part 1210, (4) advance the part 1210 a selected distance down the conveyor 1218, and (5) repeat until all segments of the part 1210 have been completed. In this manner, additive manufacture and clean-up (e.g., separation and/or reclamation of unused or unamalgamated granular material) may be performed in parallel (i.e., at the same time) at different locations or zones on the conveyor. Thus, additive manufacture in accordance with the present invention need not stop for removal of granular material and/or parts.

A system can define or include multiple zones 1236a-c. Different tasks may be performed in different zones. In selected embodiments, different zones may correspond to different locations along a conveyor. Accordingly, a conveyor may advance (e.g., translate in direction indicated by arrow 1232) a part through the various zones of a system. In certain embodiments, a system may include three zones 1236a, 1236b, 1236c. A first zone 1236a may correspond to, include, or span the portion of a conveyor where additive manufacture occurs. Thus, a first zone 1236a may correspond to the area on a conveyor where the various layers of granular material 144 are being laid down and granular material is being maintained in intimate contact with a part.

A second zone 1236b may directly follow a first zone 1236a. A second zone 1236b may be characterized by a significant portion of the unamalgamated portion of a granular material moving away from a part. For example, in a second zone 1236b, one or more walls may terminate or be removed so that the unamalgamated portion of a granular material may no longer be fully contained in the lateral direction 1211*b*. As a result, some of the unamalgamated portion of a granular material may spill off the sides of one or more plates, a conveyor, or the like. The spilling granular material may fall into one or more containers where it may be collected and reused.

A third zone 1236*c* may directly follow a second zone 1236*b*. A third zone 1236*c* may be characterized by a portion of a part 1210 within the third zone 1236*c* being exposed to view (e.g., completely, substantially, or partially exposed to view by the removal or movement of a significant portion of the unamalgamated portion of a granular material) without the part 1210 changing its position in the lateral and transverse directions 1211*b*, 1211*c*.

For example, in certain embodiments, a leading portion of a part 1210 may reach a third zone 1236*c* while a trailing portion of the part 1210 is still being manufactured within the first zone 1236*a*. Accordingly, in selected embodiments, a conveyor, one or more plates, one or more temporary supports 1223, one or more walls, or the like or a combination or sub-combination thereof may cooperate to maintain a leading portion of a part 1210 in the same position in the lateral and transverse directions 1211*a*, 1211*c* as the leading portion occupied within the first zone 1236*a* and the second zone 1236*b*. Thus, the position of the leading portion of the part 1210 may not excessively disrupt, distort, or the like additive manufacture that is occurring on a trailing portion of the part 1210 in the first zone 1236*a*.

In selected embodiments, all of the unamalgamated portion of a granular material that is external to a part 1210 may be removed in the second zone 1236*b* or within some combination of the second and third zones 1236*b*, 1236*c*. However, in certain alternative embodiments, a bed may be removed from a conveyor with four walls intact. Accordingly, all or some remainder of the unamalgamated portion of a granular material may be removed at a station that is spaced some distance from a first zone 1236*a*.

In another embodiment, a ramp may be used to transition from a lower segment or zone to a subsequent, higher segment or zone. For example, a ramp may enable a trailing wall corresponding to a lower segment to be built up higher by a process of additive manufacture than the majority of the lower segment so that the trailing wall can become a leading wall for a subsequent, higher segment. Building a ramp may be much faster than laying down complete layers (e.g., layers covering the entire lower segment) when only the trailing wall is being built up.

A ramp may include a plurality of layers of granular material whose length in one or more directions (e.g., the longitudinal direction 1211*a*) is incrementally changed. For example, within a ramp, each successive layer may be shorter in length than the immediately preceding layer. The resulting angle of a ramp with respect to the horizontal may be less than a critical angle of repose for the granular material. Accordingly, the granular material forming the ramp may be stable and not slough off or move due to the acceleration of gravity acting thereon.

In operation, a first layer of granules of the granular material can be distributed and radiant energy directed at all granules within the first layer that form part of the selected granules. A second layer of granules of the granular material is distributed over the top of the first layer and radiant energy directed at all granules within the second layer that form part of the selected granules. The first layer can define a first plane and the second layer defines a second plane that is parallel to the first plane. In certain embodiments, the first and second planes are both horizontal planes. In other embodiments, the first and second planes both extend at an angle with respect to a horizontal plane that is greater than zero and less than or equal to a critical angle of repose of the granular material, forming a ramp.

Figure 13A:
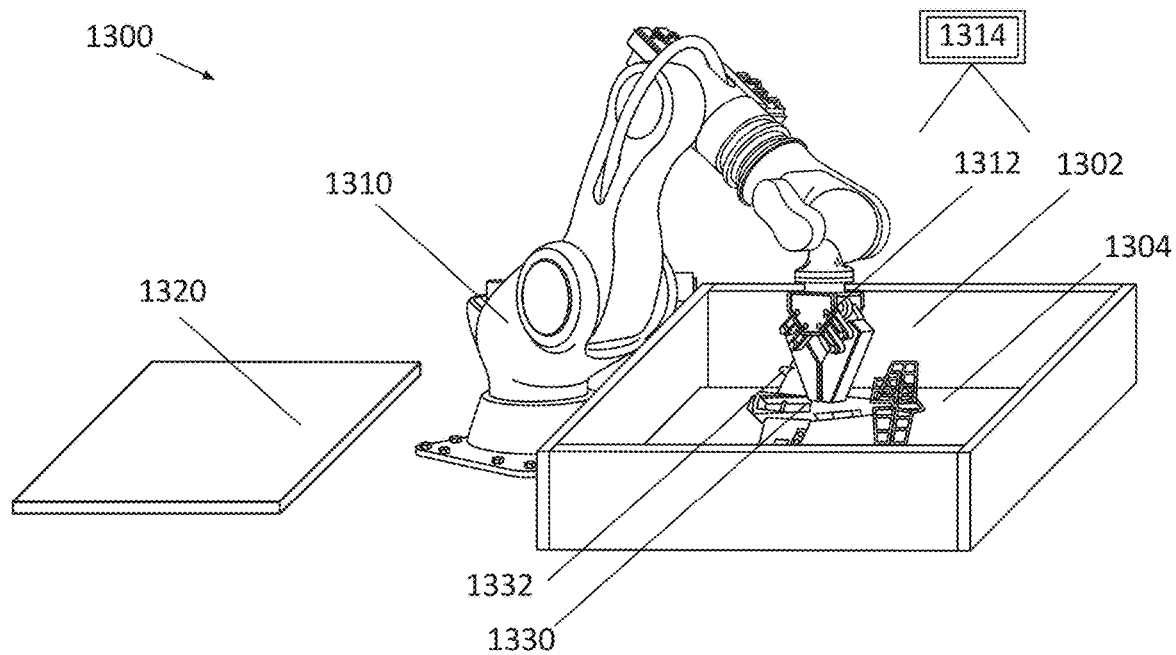
FIGS. 13A-C illustrate handling of a part at a manipulation point.

FIG. 13A illustrates an additive manufacturing system 1300 that includes a powder chamber 1302 with a powder bed 1304. The system 1300 can also include a processing platform 1320, which can be a designated processing area, another powder chamber, a coating station, a conveyor, a shipping container, or any other needed manufacturing system component. The system 1300 also includes a robot arm 1310 with manipulator 1312 capable of grasping a part 1330 by its additively manufactured manipulation point 1332. Sensor systems 1334 can be mounted on the robot arm 1310, or alternatively, on, in, or near the powder chamber 1302.

While a six degree of freedom single robot arm with clamping graspers is a manipulation device shown in the Figure, other automated, mechanical or manual embodiments can be employed. For example, cranes, lifts, hydraulic arms, clamps, tracks or rails, pinning mechanisms, or any other type of manually or automatically controllable manipulation device can be used. A manipulation device can be mounted beside, on, near, or within the powder chamber 1302. Alternatively, a manipulation device can be movably mounted on rails over, near, or positioned within the powder chamber. Multiple manipulation devices can be used in some embodiments.

A manipulation device can include position, depth, laser scanning, or similar sensor systems 1314. Sensors can be mounted on or near the manipulator, elsewhere on the robot arm, or on, near, or within the powder chamber or processing platform 1320. In certain embodiments, a sensor can be movable, with hinged, rail, hydraulic piston, or other suitable actuating mechanisms used to rotate, elevate, depress, oscillate, or laterally scan the sensor. In certain embodiments, conventional RGB CMOS or CCD sensors can be used, alone or in combination specialized depth sensors or optical edge tracking sense systems. Embodiments can be selected to improve 3D localization of a part, including identification and use guides, markers, or other detectable positioning indicia.

Figure 13B:
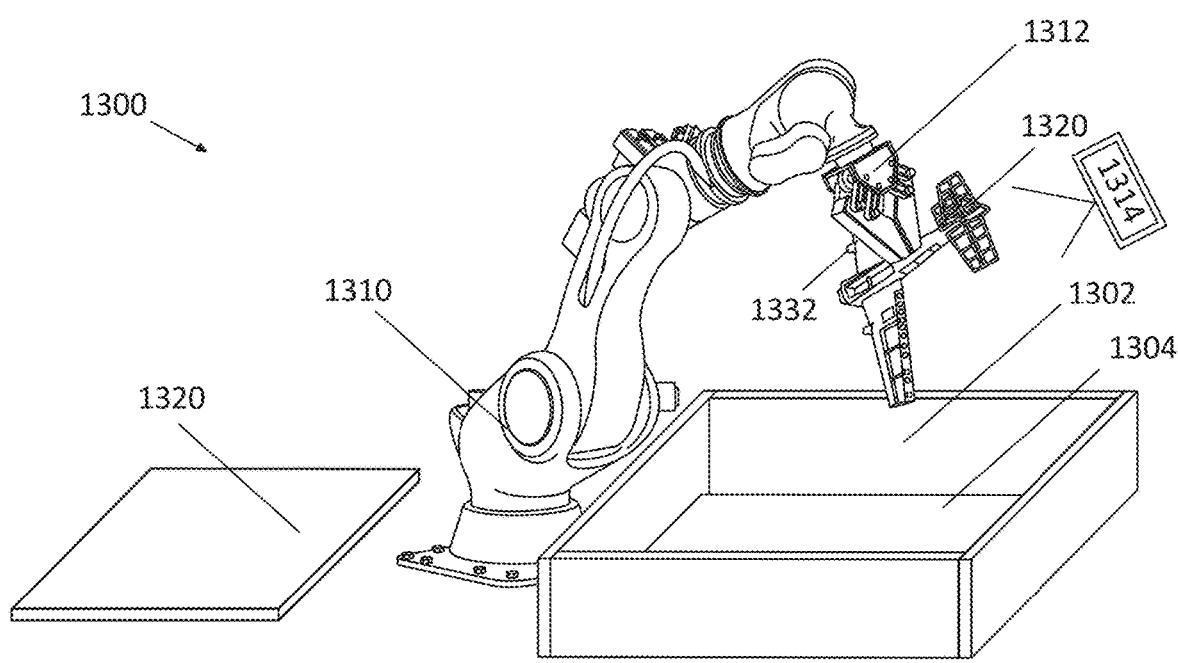

FIG. 13B illustrates the system described with respect to FIG. 13A, with the robot arm 1310 lifting and reorienting a part 1330 by one of its additively manufactured manipulation points 1332. In some embodiments, the part 1330 can be lifted, rotated, linearly translated, and set back onto the powder bed 1304 for further processing.

Figure 13C:
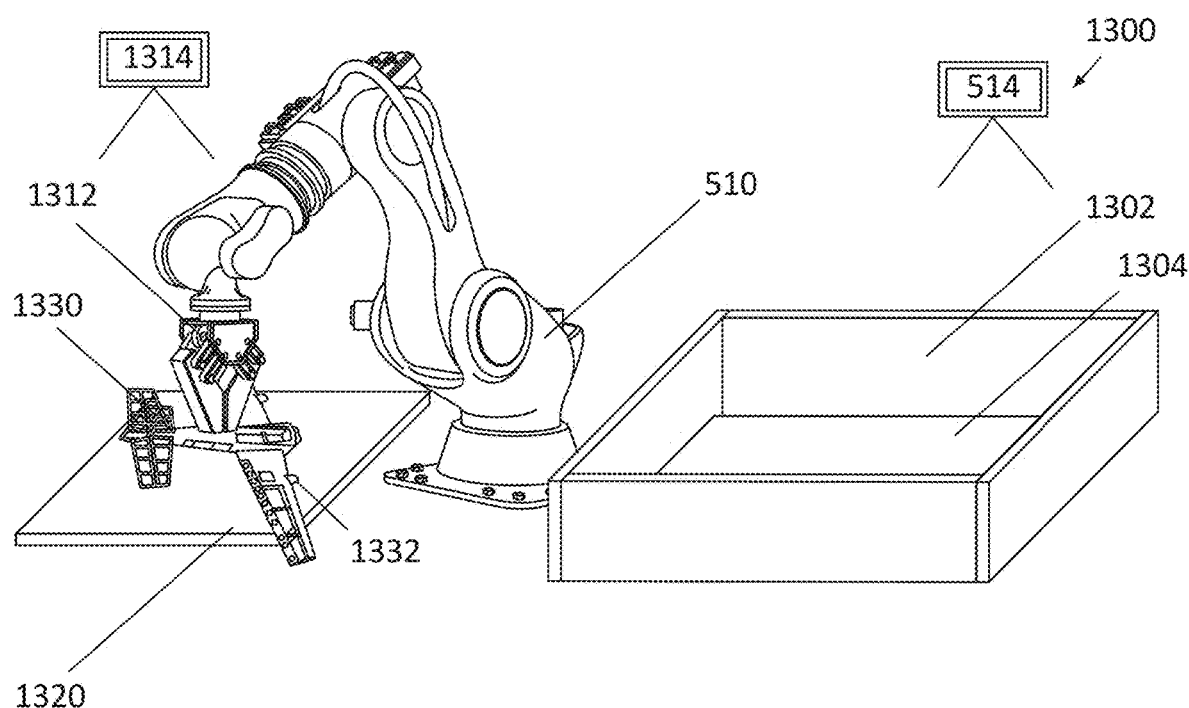

FIG. 13C illustrates the system described with respect to FIG. 13A, with the robot arm 1310 lifting and reorienting a part 1330 by one of its additively manufactured manipulation points 1332. In this embodiment, the part 1330 lifted, rotated, and set onto the processing platform 1320 for further processing.

Figure 14:
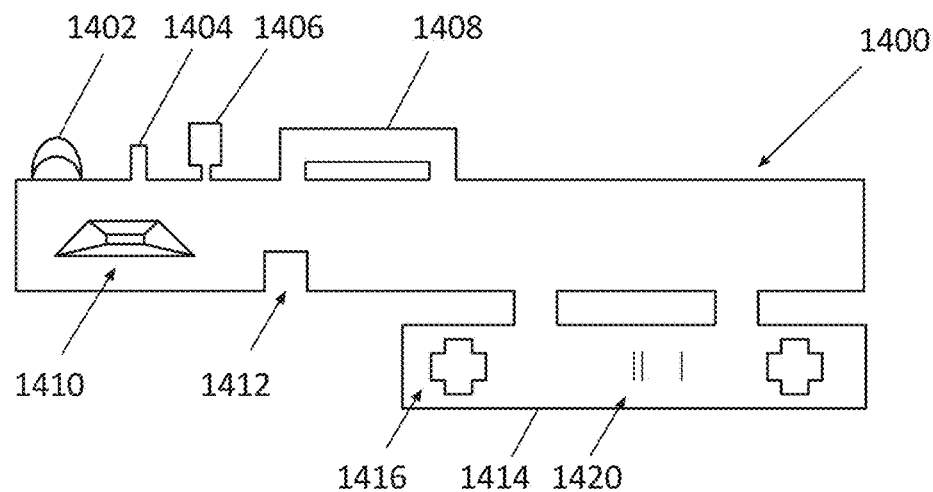
FIG. 14 is a representative part having additively defined manipulation points.

FIG. 14 illustrates a part 1400 including various possible additively manufactured robot manipulation points. Part 1400 supports various projecting structures (i.e. 1402, 1404, 1406, 1408, and 1414), as well as internal structures or cavities (i.e. 1410, 1412, and 1416), capable of acting as robot manipulation points. In the Figure, structure 1402 is a lunate tab having two narrow connection points to part 1400. The tab portion allows for easy engagement with manipulators having nipping or pinching graspers, while the narrow connection points simplify removal of the structure 1402 by mechanical clipping, sawing, punching, or drilling; or by directed energy beams. Similarly, pin 1404 is a small projecting structure capable of being engaged by nipping or pinching graspers, or by a "bit" holding type engagement system that surrounds and constricts to hold the pin 1402. Rectangular tab 1406 is attached at a single narrow point, allowing some embodiments of the manipulator to twist and break free the tab after the part has been moved to a desired area/position. Plate 1408, again attached at two points to simplify later removal by mechanical clipping or energy beams, is relatively long and broad to simplify the engagement by the manipulator.

Additive manufacturing of the part 1400 can be designed to include depressions, lands, cavities, holes, or other internally defined structures that do not greatly affect part function, but improve reliability of engagement with the robot arm. For example, prismatic locking cavity 1410 can guide a pin or clamp system into engagement with the cavity. Alternatively, spreading grippers can be used to engage a notch 1412 defined in the part 1400. Cavities or openings 1416 can also be defined in removable projecting tabs 1414 if needed. In some embodiments, cavities or opening in a substantially additively manufactured part can be defined by subtractive machining, drilling, punching, or removal of material be etching or directed energy beams. In certain other embodiments, after use the cavities can be filled using additive manufacturing techniques, by use of thermoset plastics, or any other suitable fill technique.

In some embodiments, two or three-dimensional positioning of the part 1400 can be improved by use of imaging or other optic sensors that identify precise position of the part using projecting tab or cavity position. In other embodiments, marking optical guides or indicia 1420 can be additively formed or mechanically or laser inscribed on the projecting structure or the part itself to improved guidance for engagement of 3D positioning after movement.

In one embodiment, processing can occur with the following steps. In a first step, material is positioned on a powder bed in a powder chamber. Then, using directed beams of two-dimensionally patterned energy, a part is manufactured that includes one or more manipulation points. The manipulator can engage the manipulation point, and lift the part away from a powder bed. The part can be repositioned on the powder bed for further processing, or alternatively moved to a new processing area away from the powder bed and chamber. In an optional step, the manipulation point can be removed (e.g. a projecting tab is mechanically clipped), or infilled (e.g. additively defined holes or cavities filled with an epoxy resin).

Figure 15:
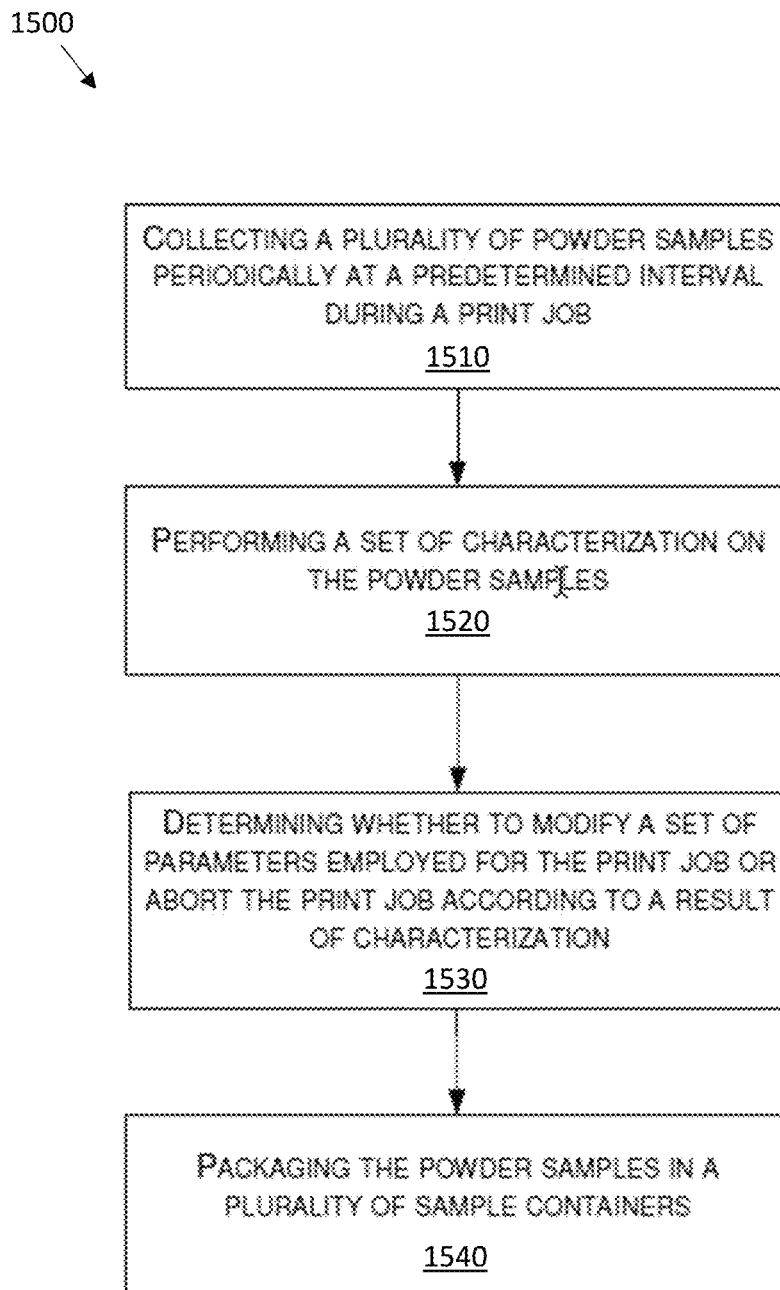
FIG. 15 is a flow chart illustrating powder sample testing and characterization.

FIG. 15 illustrates an example process 1500 of collecting and characterizing powder samples of a powdered material during a print process. Process 1500 may be utilized to collect the powder samples from a powder bed or a powder distribution assembly, and characterizing the powder samples in real-time in a test suite in accordance with the present disclosure. At 1510, process 1500 may involve controlling an ingester to collect a plurality of powder samples of a powdered material in forming a printed object during a print cycle. The powdered material may include metal, ceramic, plastic powders, or other suitable powders able to bond together while subjected to a thermal energy. The ingester can collect powder samples periodically at a predetermined interval or randomly or at predetermined stages during a print process. For example, powder samples can be collected at every 10-minute interval or only at ⅕th and ⅘th completion of a print process. Ingester may have a mechanism for diverting incoming powder from a powder bed or powder dispensing assembly. The ingester may also control an amount of powders being diverted, depending how many tests are required for analysis. At 1520, process 1500 may involve controlling a test suite to perform one or more tests of test. In some embodiments, one or more specific properties of a powdered material may need to be tightly controlled within a certain range to guarantee the mechanical, electrical, or optical properties of the printed object. In other embodiments, characteristics of powders during a print process may need to be retained for auditing purposes. Test suites may include instruments having capabilities to perform one or more tests. For illustrating purposes and without limitation, one test may measure a distribution of powder sizes by particle size analyzer; a second test may measure a density of powder samples by pycnometer; a third test may identify substances within the powder samples by gas chromatography mass spectrometry. At 1530, process 1500 may involve determining whether to modify a set of printing parameters employed for the print process or whether to abort the print process according to a result characterization from test(s). The determination may include computer simulations based on a set of models using results of the characterizations as input. Powder samples may have undergone undesired changes for powders without certification or inadequate processing conditions. Tests may provide a real-time feedback on the properties of powders during the print process. One or more printing parameters can be modified according to results of tests. For example, incident beam intensity may be increased or decreased when gas pycnometer measures a deviation of specified powder density which may affect the energy per unit volume required to melt or sinter the powders. Dwell time of the incident beam provided by a print head or a thickness of powder layer dispensed by powder dispensing assembly can also be controlled to adjust for the energy requirement change. If the deviation of the energy per unit volume to the specified powder density is too large, the print process can be halted or aborted since the energy source inside print head may not meet the requirement to melt the powders. In another example, contaminations within powder samples may be detected by gas chromatography mass spectroscopy, which may affect one or more electrical, mechanical and optical properties of the printed object. In still other embodiments, the print process can be stopped if characterization results indicate usage of unlicensed powders or dangerous powders, including unlicensed powders likely to result in inferior additive manufacturing results.

In some embodiments, prediction of final print quality based on the results of in-process (in real-time or in-situ) characterizations of powder samples may be performed by simulations using a set of models. For example, dimensional controls of the printed object may rely on a resolution of the incident beam and a temperature gradient of powders across the boundary of melted region. The melted region may expand beyond the intended boundary if the temperature does not drop quick enough across the boundary and result in exceeding the tolerance of the dimensional requirement. The temperature gradient may be simulated by a heat transfer model which calculates a heat conduction rate based on properties of powders such as on the compositions and sizes of powders. If the predicted dimension of a printed object by the simulation model exceeds the tolerance of dimensional requirement, the print process can be aborted.

At 1540, process 5100 may involve storage of powder samples in a plurality of sample canister. The sample canisters may be stored for analyses that may not be suitable for in-process characterization or for auditing purposes later. Storage containers may be capable of packaging powder samples in an atmosphere substantially equivalent to the in-process (in real-time or in-situ) atmosphere inside sample canisters. The atmosphere may be vacuum, air, or an inert gas such as nitrogen, carbon dioxide, argon, helium, or other noble gas.

Figure 16:
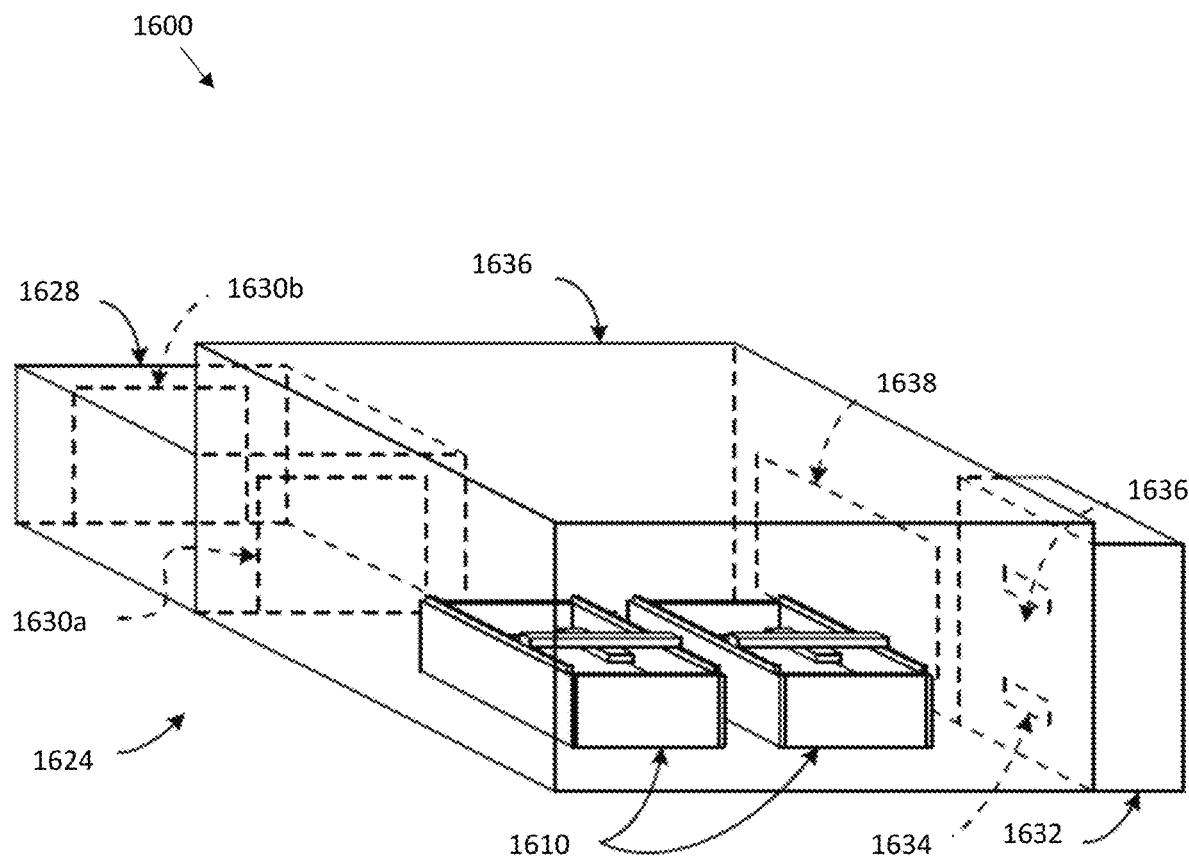
FIG. 16 is an illustration of an enclosed additive manufacturing facility.

Referring to FIG. 16, a manufacturing facility 1624 in accordance with the present invention may comprise one or more machines 1610 contained within an enclosure 1626. Such an enclosure 1626 may control one or more environmental conditions as desired or necessary. For example, an enclosure 1626 may protect a printed or to-be-printed material from unwanted thermal, chemical, photonic, radiative, or electronic reactions or interactions or the like or combinations or sub-combinations thereof. An enclosure 1626 may also protect human operators or other nearby personnel from potentially harmful aspects of a machine and machine powders 1610 such as heat, UV light, chemical reactions, radioactive decay products, and laser exposure.

The one or more machines 1610 contained within a particular enclosure 1626 may all be the same size or of varying sizes. Similarly, the one or more machines 1610 contained within a particular enclosure 1626 may all be the same type or of varying types. For example, in selected embodiments, each of the one or more machines 1610 within an enclosure 1626 may amalgamate (e.g., unite, bond, fuse, sinter, melt, or the like) a particular granular material in a batch process. In other embodiments, each of the one or more machines 1610 within an enclosure 1626 may amalgamate a particular granular material in a continuous process. In still other embodiments, one or more machines 1610 within an enclosure 1626 may amalgamate a particular granular material in a batch process, while one or more other machines 1610 within the enclosure 1626 may amalgamate the particular granular material in a continuous process.

In certain embodiments, a manufacturing facility 1624 may include one or more airlocks 1628 forming one or more antechambers for a corresponding enclosure 1626. An airlock 1628 may enable parts, material 144, personnel, or the like to pass into and out of an enclosure 1626 without compromising the environment (e.g., the low oxygen and inert gas environment) within the enclosure 1626. An airlock 1628 may include at least two airtight (or substantially airtight) doors 1630a, 1630b. A first door 1630a of an airlock 1628 may enable parts, materials 144, personnel, or the like to pass between the interior of the airlock 1628 and the interior of the corresponding enclosure 1626. A second door 1630b may enable parts, materials 144, personnel, or the like to pass between the interior of the airlock 1628 and an exterior environment surrounding the corresponding enclosure 1626. An airlock 1628 may also include an gas exchange system (not shown) that may purge and/or vent the airlock 1628 as desired or necessary to efficiently transition the gaseous environment within the airlock 1628 between a state compatible with the interior of the enclosure 1626 and a state compatible with the environment exterior to the enclosure 1626.

One or more machines 1610 may be arranged in an enclosure 1626 so that sufficient space around the machines 1610 is preserved for one or more human workers, robots, or the like to access the machines 1610, remove parts therefrom, vacuum up unamalgamated granular material 144 for reuse, or the like. Alternatively, or in addition thereto, an enclosure 1626 may include various gantries, catwalks, or the like that enable one or more human workers, robots, or the like to access the machines 1610 (e.g., visually access, physical access) from above. This may be helpful when an enclosure 1626 contains one or more large machines 1610 where access from the edges or sides thereof may be insufficient for certain tasks.

In certain embodiments, a manufacturing facility 1624 may include one or more gas management systems 1632 controlling the make-up of gaseous matter within an enclosure 1626. A gas management system 1632 may maintain concentrations of inert or substantially inert gas (e.g., vacuum, nitrogen, argon, carbon-dioxide, or the like or a combination or sub-combination thereof) above a desired level (e.g., argon at or above about 99.9% by volume). Alternatively, or in addition thereto, a gas management system may maintain concentrations of oxygen and/or water vapor below atmospheric levels. For example, in one embodiment a desired levels can be below 0.05% by volume for gaseous oxygen, and below 0.05% by volume for water vapor.

The gaseous environment within an enclosure 1626 may be incompatible with the respiratory requirements of one or more humans that may need to enter and/or work within the enclosure 1626. Accordingly, to work within certain enclosures 1626 in accordance with the present invention, one or more workers may don personal protective equipment (PPE). Thereafter, when the worker enters an enclosure 1626, the PPE may create a barrier between the worker and the working environment within the enclosure 1626.

In selected embodiments, the PPE worn by one or more workers may include a self-contained breathing apparatus (SCBA). A SCBA may be a closed circuit device that filters, supplements, and recirculates or stores exhaled gas (e.g., a rebreather). Alternatively, SCBA may be an open circuit device that exhausts at least some exhaled gas (e.g., nitrogen, carbon dioxide, oxygen, water vapor, or a combination or sub-combination thereof) into a surrounding environment. In embodiments where an open circuit device is used, the amount exhaled by the one or more workers within an enclosure 1626 may be quite small with respect to the over size of the enclosure 1626. Accordingly, the release of oxygen, water vapor, or the like into the interior of the enclosure 1626 may be sufficiently small as to be negligible or at least within acceptable limits (e.g., within the capacity of a gas management system 1632 to rectify).

Figure 17:
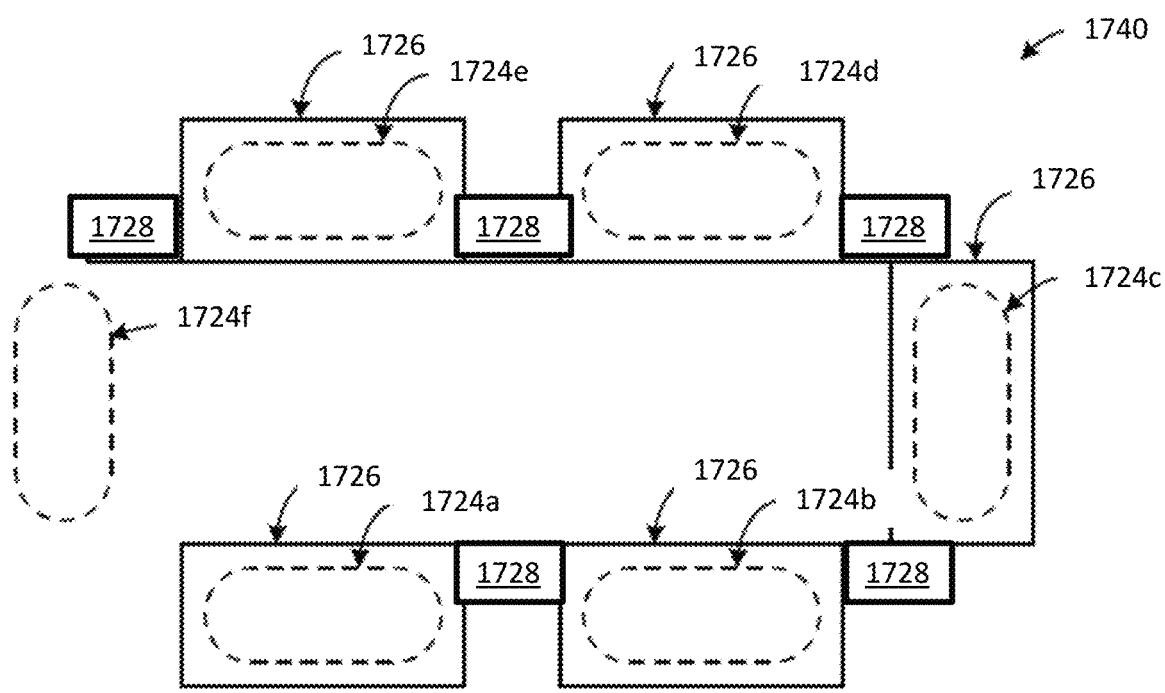
FIG. 17 is an illustration of an additive manufacturing facility having multiple work areas

Referring to FIG. 17, in selected embodiments, a manufacturing facility may comprise multiple work areas 1724 connected by one or more interface mechanisms 1728 to form a network 1740. One or more of the work areas 1724 forming such a network 1740 may be contained within enclosures 1726. One or more of the work areas 1724 forming such a network 1740 may not need an enclosure 1726 and, therefore, may not be contained within one. One or more of the work areas 1724 forming such a network 1740 may be contained within one or more buildings. For example, in selected embodiments, all of the various work areas 1724 forming a network 1740 may be contained within a single building. In such embodiments, any work areas 1724 contained within enclosures 1726 may be work areas 1724 that require more environmental conditioning than that provided by the building.

The various work areas 1724 of a network 1740 may be defined and/or arranged to correspond to certain manufacturing-related processes. Such processes may include creating parts via additive manufacture; removal of parts from the machines that created them; removal of unamalgamated granular material; separating parts from a base or bed, one or more support structures (e.g., exterior portions of one or more traveling walls that extend through a part, one or more temporary structures printed to support a part during additive manufacture that will not be included within the finished part, etc.), or the like; heat treating; peening; powder coating, painting, anodizing, or the like; packaging for shipment; or the like or a combination or sub-combination thereof.

For example, in selected embodiments, a network 1740 may include a first work area 1724a for powder-bed fusion in an inert environment provided by an enclosure 1726, a second work area 1724b for removing granular material 144 from a build platform 146 in an enclosure 1726, a third work area 1724c for shot peening to improve surface finish in an enclosure 1726, a fourth work area 1724d for heat treating to anneal metal parts in an enclosure 1726, a fifth work area 1724e for removing parts from the build platform 146 in an enclosure 1726, a sixth work area 1724f for packing and shipping, or the like or a combination or sub-combination thereof.

In a first work area 1724a, one or more machines may be contained within an enclosure 1726. The machines may all be the same size or of varying sizes. Similarly, the one or more machines may all be the same type or of varying types. For example, in selected embodiments, each of the one or more machines within an enclosure 1726 may amalgamate (e.g., unite, bond, fuse, sinter, melt, or the like) a particular granular material in a batch process. In other embodiments, each of the one or more machines within an enclosure may amalgamate a particular granular material in a continuous process. In still other embodiments, one or more machines within an enclosure may amalgamate a particular granular material in a batch process, while one or more other machines within the enclosure may amalgamate the particular granular material in a continuous process.

One or more machines of a first work area 1724a may be arranged so that sufficient space around the machines is preserved for one or more human workers, robots, or the like to access the machines, remove parts therefrom, vacuum up unamalgamated granular material for reuse, or the like. Alternatively, or in addition thereto, a first work area 1724a may include various gantries, catwalks, or the like that enable one or more human workers, robots, or the like to access the machines (e.g., visually access, physical access) from above. This may be helpful when a first work area 1724a includes one or more large machines where access from the edges or sides thereof may be insufficient for certain tasks.

In a second work area 1724b, unamalgamated granular material may be removed from a build platform through various methods. For example, a vacuum mechanism having a collection port that is controlled (e.g., moved) manually or robotically may be used to collect unamalgamated granular material from around a part, off a build platform or bed or the like. Alternatively, or in addition thereto, one or more flows of pressurized gas that are controlled (e.g., aimed) manually or robotically may be used to dislodge the unamalgamated granular material from certain crevices, sweep the unamalgamated granular material off a build platform or bed, and/or move the unamalgamated granular material to one or more locations where it can be accessed by a vacuum.

In selected embodiments, first and second work areas 1724a, 1724b may be contained within separate enclosures 1726 as illustrated. In other embodiments, first and second work areas 1724a, 1724b may be contained within the same enclosure 1726. Moreover, in certain embodiments, first and second work areas 1724a, 1724b may geographically overlap to at least some degree, but may be temporally spaced in time (e.g., one or more tasks corresponding to one work area 1724a may be performed at a different time than one or more tasks corresponding to the other work area 1724b).

Alternatively, first and second work areas 1724a, 1724b may be geographically adjacent one another, but may temporally overlap to some degree (e.g., one or more tasks corresponding to one work area 1724a may be performed at the same time as one or more tasks corresponding to the other work area 1724b). In such embodiments, a first zone of a machine may correspond to or be a first work area 1724a and a second zone (or a combination of the second and third zones) may correspond to or be a second work area 1724b.

In a third work area 1724c, a peening process may be manually or robotically applied to one or more parts. For example, in selected embodiments, a manual or robotic system may use the same granular material (i.e., the same granular material used to create the parts) as a shot media in a peening process to improve a surface finish of the parts. In a fourth work area 1724d, an enclosure 1726 may be or comprise an oven for heat treating one or more parts. Such an enclosure 1726 may, therefore, be configured to generate, retain, and control significant amounts of heat. The exact amount of heat may vary between the size of the enclosure 1726, the nature of the parts being heat treated, and the like.

In a fifth work area 1724e, one or more build platforms or beds may be separated from the parts they supported, one or more exterior portions of one or more traveling walls that extend through parts may be removed, one or more temporary structures printed to support parts during additive manufacture that will not be included within the finished parts may be removed, or the like or a combination thereof. In selected embodiments, this may involve wire electrical discharge machining (EDM) process. In such embodiments, parts may be submerged within a bath of partially de-ionized water where the ion content is carefully controlled as part of the EDM process. An enclosure for a fifth work area 1724e may be included or omitted as desired or necessary.

In a sixth work area 1724f, one or more parts may be prepared for shipping and/or shipped. For example, in a sixth work area 1724f, one or more parts may be painted, packaged, wrapped with plastic, secured to one or more pallets, or the like and loaded on a truck for shipment. An enclosure for a sixth work area 1724f may be included or omitted as desired or necessary.

In selected embodiments, a network 1740 may comprise a plurality of work areas 1724 connected in series by one or more interface mechanisms 1728. Such interface mechanisms 1728 may enable one or more parts to flow smoothly and efficiently from one work area 1724 to the next. Accordingly, the work areas 1724 may be arranged in the network 1740 so that the tasks associated therewith may be performed in the required or desired order.

Any of the described enclosures may maintain concentrations of inert or substantially inert gas (e.g., vacuum, nitrogen, argon, carbon-dioxide, or the like or a combination or sub-combination thereof) above a desired level (e.g., argon at or above about 99.9% by volume). Alternatively, or in addition thereto, an enclosure may maintain concentrations of oxygen and/or water vapor below atmospheric levels (e.g., below 0.05% by volume for gaseous oxygen, below 0.05% by volume for water vapor).

Vehicles can be used transport print beds, parts, or other materials via interface mechanisms 1728 by rolling or otherwise moving over a path (e.g., a concrete floor), conveyor system, rail, or combination of multiple rails using traditional railroad concepts, linear movement on a track using an encoder, linear motion provided by a pulley system, motion and/or levitation provided by magnetic levitation rails, motion via a conveyor system or belt, or the like or a combination or sub-combination thereof. Large parts weighing 2,000 kilograms or more can be transported. A vehicle may have wheels that roll on a supporting surface. A support surface may be a floor (e.g., a floor having a visually, electronically, or magnetically detectable path applied thereto or embedded therewithin). A support surface may also be one or more rails. Such rails may be located below a part being carried by a vehicle. Alternatively, such rails may be located above a part being carried by a vehicle. That is, the rails may be overhead rails and a vehicle may be carriage or trolley rolling on the overhead rails while suspending a part therebelow.

Wheeled or other vehicles can be controlled and/or operated manually, automatically, autonomously, or semi-autonomously. For example, in selected embodiments, one or more wheeled vehicles may be pushed and/or steered by one or more human operators. In other embodiments, various on-board or off-board control systems may sense what is happening with respect to a vehicle and instruct the vehicle when to move, when to stop, how to steer, and the like.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. An additive manufacturing system, comprising:
a first laser to emit a first light beam at a first wavelength;
a second laser to emit a second light beam at a second wavelength different from the first wavelength;
beam shaping optics that form a common beam, the beam shaping optics including at least one wavelength filter to pass the first light beam of the first wavelength and reflect the second light beam of the second wavelength in a common beam;
an optically addressable light patterning unit to receive the common beam and emit light as a two-dimensional patterned beam, with the optically addressable light patterning unit rejecting energy not required to form the two-dimensional patterned beam;
an image relay to receive the two-dimensional patterned beam and focus it as a two-dimensional image on a powder bed; and
a rejected energy handling unit to reuse the rejected energy.

2. The additive manufacturing system of claim 1, wherein the rejected energy is repatterned and directed against the powder bed.

3. The additive manufacturing system of claim 1, wherein the optically addressable light patterning unit reflects the light to form the two-dimensional patterned beam.

4. An additive manufacturing system, comprising:
one or more light sources to emit one or more beams of light;
a first optical assembly configured to receive multiple beams of light including at least the one or more beams of light from the one or more light sources, the first optical assembly further configured to multiplex the multiple beams of light;
an optical device configured to reshape and blend the multiple beams of light to provide a first beam of light;
a light patterning unit including a spatial polarization valve configured to apply a spatial polarization pattern on the first beam of light to provide a second beam of light directable toward a powder bed, wherein the spatial polarization valve is optically addressable to form a two-dimensional pattern;
a polarizer configured to split polarization states of the second beam of light to reflect a third beam of light;
a second optical assembly configured to reshape the third beam of light into a fourth beam of light, rotate its polarization state to that of the first beam of light, the second optical assembly further configured to introduce the fourth beam of light to the first optical assembly as one of the multiple beams of light to result in a fifth beam of light that is transmitted through and not reflected by the polarizer; and
an image relay to receive the two-dimensional patterned beam and focus it as a two-dimensional image on the powder bed.

5. An additive manufacturing system, comprising:
a plurality of lens assemblies comprising swappable portions configured to provide a plurality of magnification ratios that proportionally increase or decrease a size of an image of an incident light;
a mechanical assembly capable of selecting one of the lens assemblies to provide one of the magnification ratios to convert a first image of the incident light to a second image of the incident light according to the one of the magnification ratios;
an optically addressable light patterning unit to receive the second image of the incident light and emit a two-dimensional patterned beam, with the optically addressable light patterning unit rejecting energy not required to form the two-dimensional patterned beam;
an image relay to receive the two-dimensional patterned beam and focus it as a two-dimensional image on a powder bed; and
a rejected energy handling unit to reuse the rejected energy.

6. The additive manufacturing system of claim 5, further comprising:
a build platform gantry; and
a final beam steering device mounted on the build platform gantry and capable of directing the incident light emanating from one or more of the lens assemblies such that the second beam of light forms at a location of the powder bed holding a powdered material supported by the build platform gantry.

* * * * *